United States Patent
Takahashi et al.

(10) Patent No.: US 6,671,857 B1
(45) Date of Patent: Dec. 30, 2003

(54) METHOD OF DESIGNING INTEGRATED CIRCUIT DEVICE USING COMMON PARAMETER AT DIFFERENT DESIGN LEVELS, AND DATABASE THEREOF

(75) Inventors: Miwaka Takahashi, Kyoto (JP); Toshiyuki Yokoyama, Kyoto (JP); Akira Motohara, Hyogo (JP); Masahiro Ohashi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 338 days.

(21) Appl. No.: 09/638,397

(22) Filed: Aug. 15, 2000

(30) Foreign Application Priority Data

Aug. 18, 1999 (JP) ............................................ 11-231140
Sep. 29, 1999 (JP) ............................................ 11-277256

(51) Int. Cl.[7] .................................................. G06F 17/50
(52) U.S. Cl. ............................... 716/1; 716/21; 716/18; 716/3
(58) Field of Search ....................................... 716/1, 18

(56) References Cited

U.S. PATENT DOCUMENTS

| 5,572,436 A | 11/1996 | Dangelo et al. |
| 5,870,308 A | 2/1999 | Dangelo et al. |
| 5,907,698 A | 5/1999 | Kucukcakar et al. |
| 5,912,819 A | 6/1999 | Kucukcakar et al. |
| 6,026,228 A | * 2/2000 | Imai et al. .................... 716/18 |
| 6,526,561 B2 | * 2/2003 | Yokoyama et al. .......... 716/18 |

OTHER PUBLICATIONS

Dixit et al., 3D Geometric Simulation of MEMS Fabrication Processes: A Semantic Approach, 1997 Solid Modeling Conference, pp. 376–387, Jul. 1997.*

Hollaar et al., The Stucture and Operation of a Relational Database System in a Cell–Oriented Integrated Circuit Design System, 21st Design Automation Conference, pp. 117–125, 1984.*

A.L. Thomas, Geometric Modelling and Display Primitives Towards Specialised Hardware, Proceedings of the 10th Annual Conference on Computer Graphics and Interactive Techniques, pp. 299–310, Jul. 1983.*

* cited by examiner

Primary Examiner—A. M. Thompson
(74) Attorney, Agent, or Firm—McDermott, Will & Emery

(57) ABSTRACT

The method for designing an integrated circuit device of the present invention includes the steps of: obtaining the number of operations by a functional simulation; determining a specification model based on the number of operations; determining an behavioral model corresponding to the specification model based on the number of operations per cycle required; determining a RTL model corresponding to the behavioral model based on the number of operations per cycle required; and obtaining design data corresponding to the RTL model for implementing the function.

39 Claims, 39 Drawing Sheets

Fig. 5(a)
|  | HW | SW |
|---|---|---|
| Specification level opn | Area, Power consumption | ROM size |
| Behavioral level opn/cycle | Area, Power consumption | Power consumption |
| RTL opn/ns | Area, Power consumption | Power consumption |
Fig. 5(b)
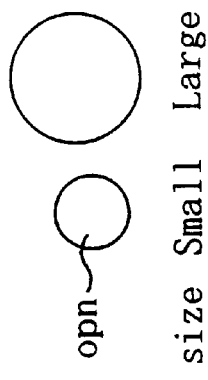
ROM size  Small   Large
Fig. 5(c)
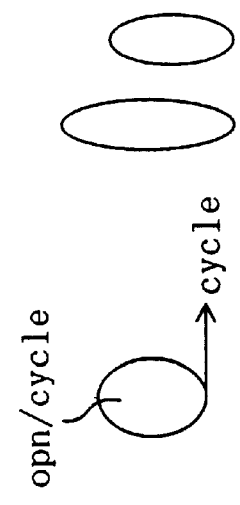
| Area | Large | Small |
| Power consumption | Large | Small |
Fig. 5(d)
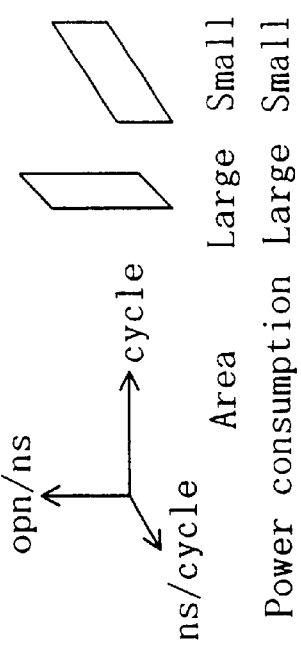
| Area | Large | Small |
| Power consumption | Large | Small |

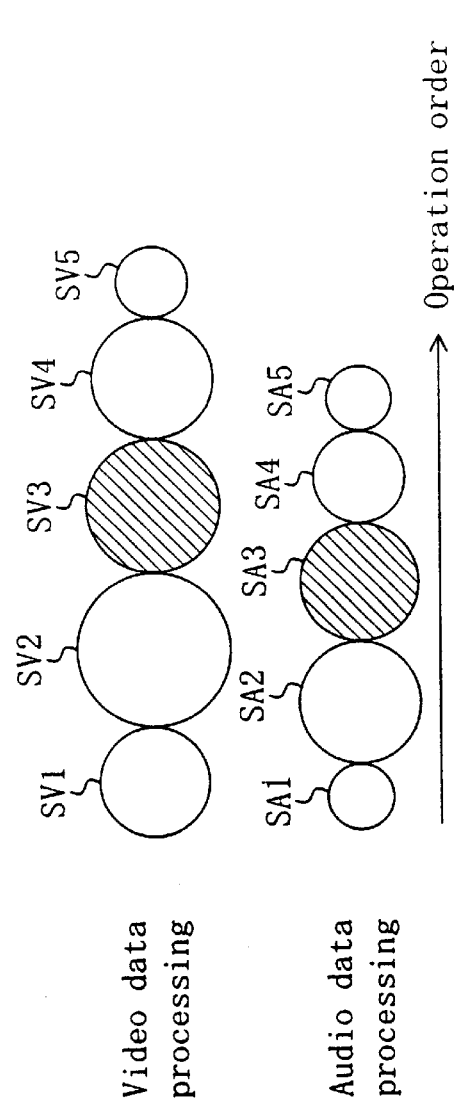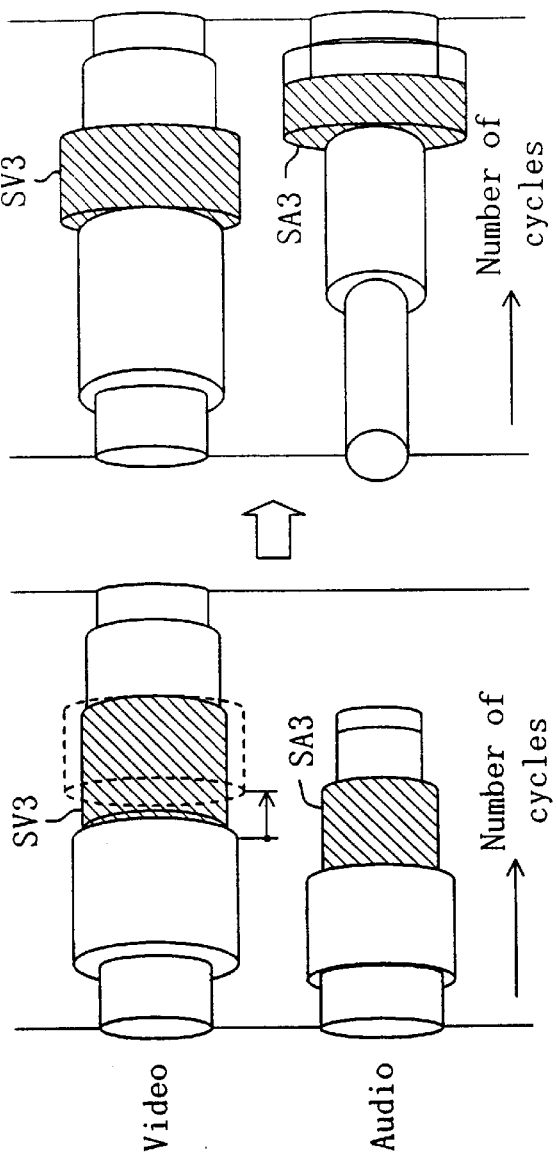

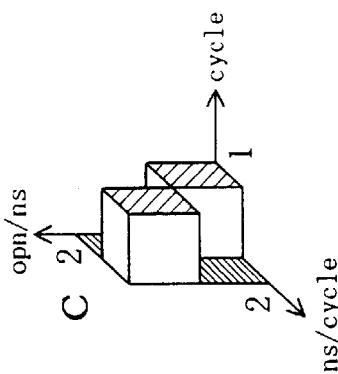
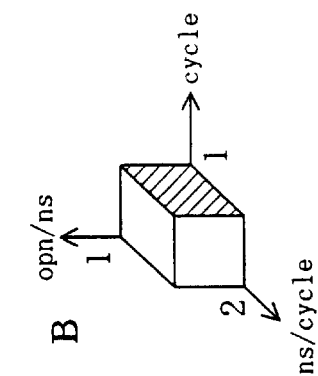
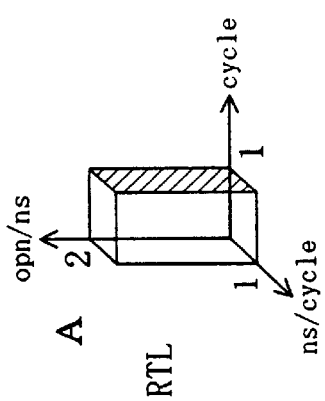
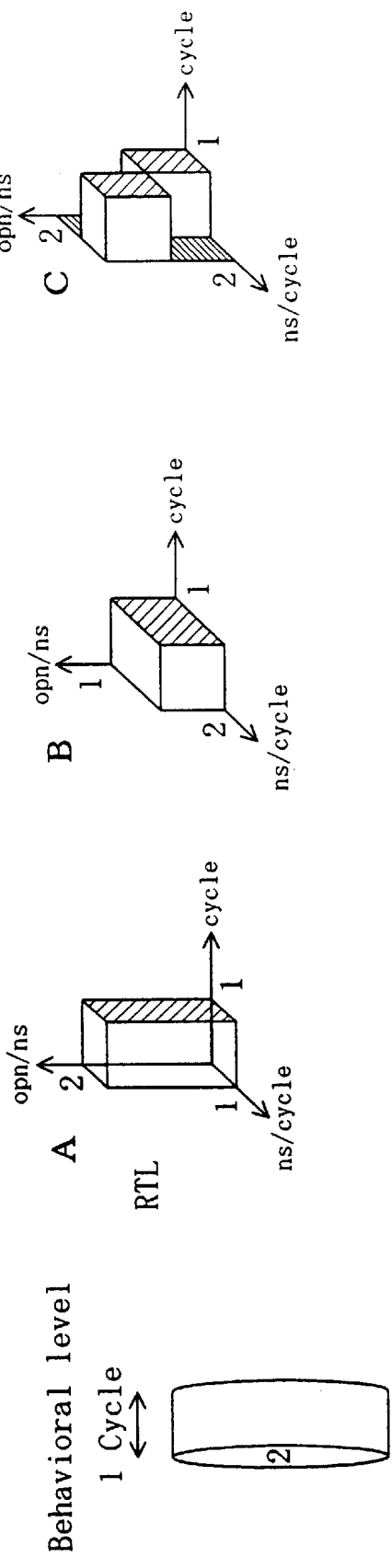
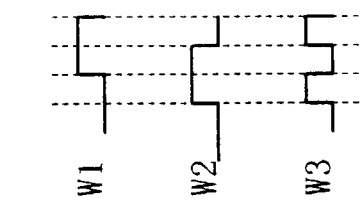
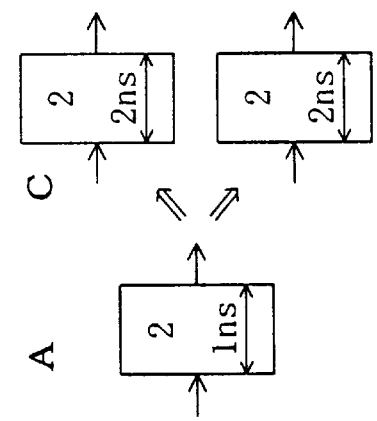
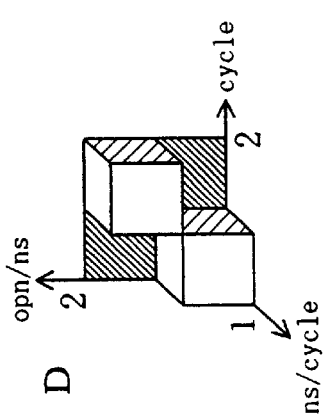

Fig. 11

|  | A | B | C | D |
|---|---|---|---|---|
| Area | 2 | 1 | 4 | 1 |
| Speed (ns) | 1 | 2 | 1 | 1×2 |
| Power consumption ($=CV^2/ns$) | 1 | 1/2 | 1/2 | 1 |

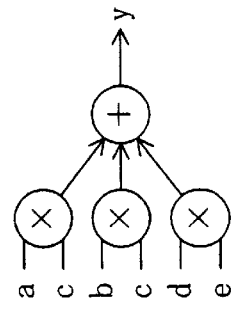
Fig. 13(a)
f=a+b
g=c*f
h=d*e
y=g+h
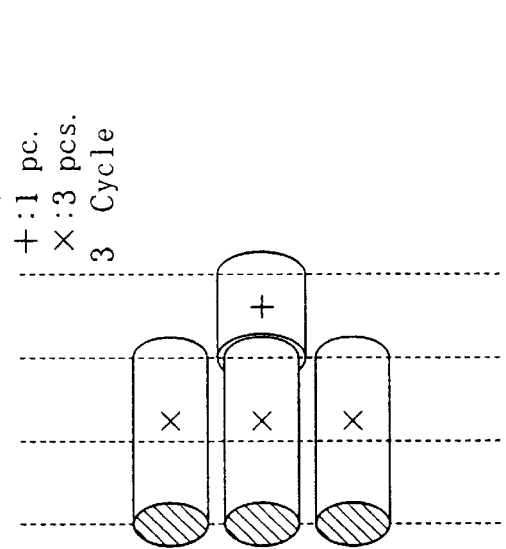
Fig. 13(b)
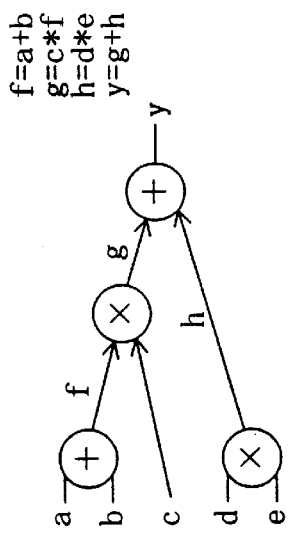
Fig. 13(c) Area advantage
+:1 pc.
×:1 pc.
3 Cycle
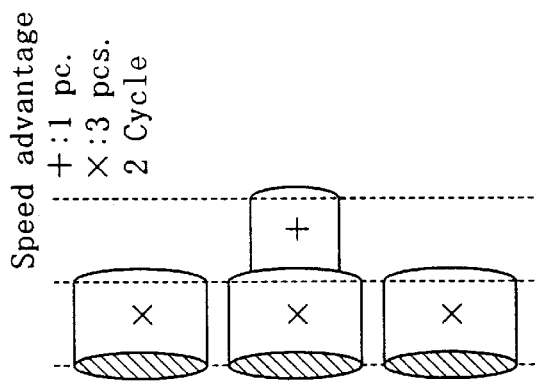
Fig. 13(d) Speed advantage
+:1 pc.
×:3 pcs.
2 Cycle
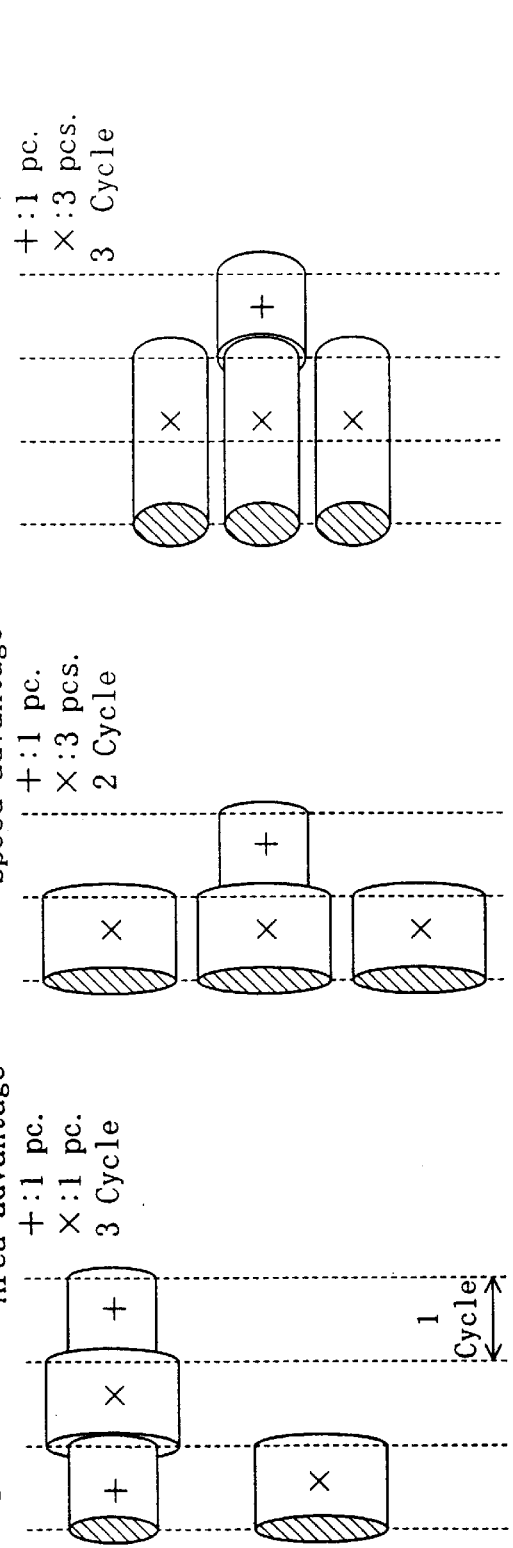
Fig. 13(e) Reliability advantage
+:1 pc.
×:3 pcs.
3 Cycle
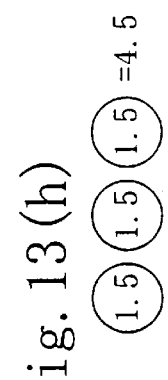
Fig. 13(f)
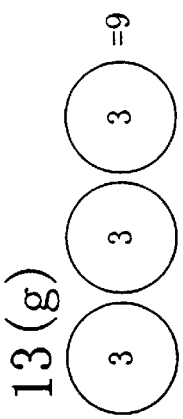
Fig. 13(g)
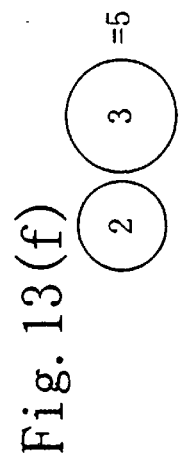
Fig. 13(h)

/* parameter=2 */

/* parameter=1 */

Fig. 16(a)

```
/* parameter=1 */
always@( posedge clk ) begin
  if( data_enable1 )
    latch_data <= data;
  else
    latch_data <= latch_data;
end
```

Fig. 16(b)

```
/* parameter=2 */
always@( posedge clk )begin
  if( data_enable1 )
    latch_data <= data1;
  else if( data_enable2 )
    latch_data <= data2;
  else
    latch_data <= latch_data;
end
```

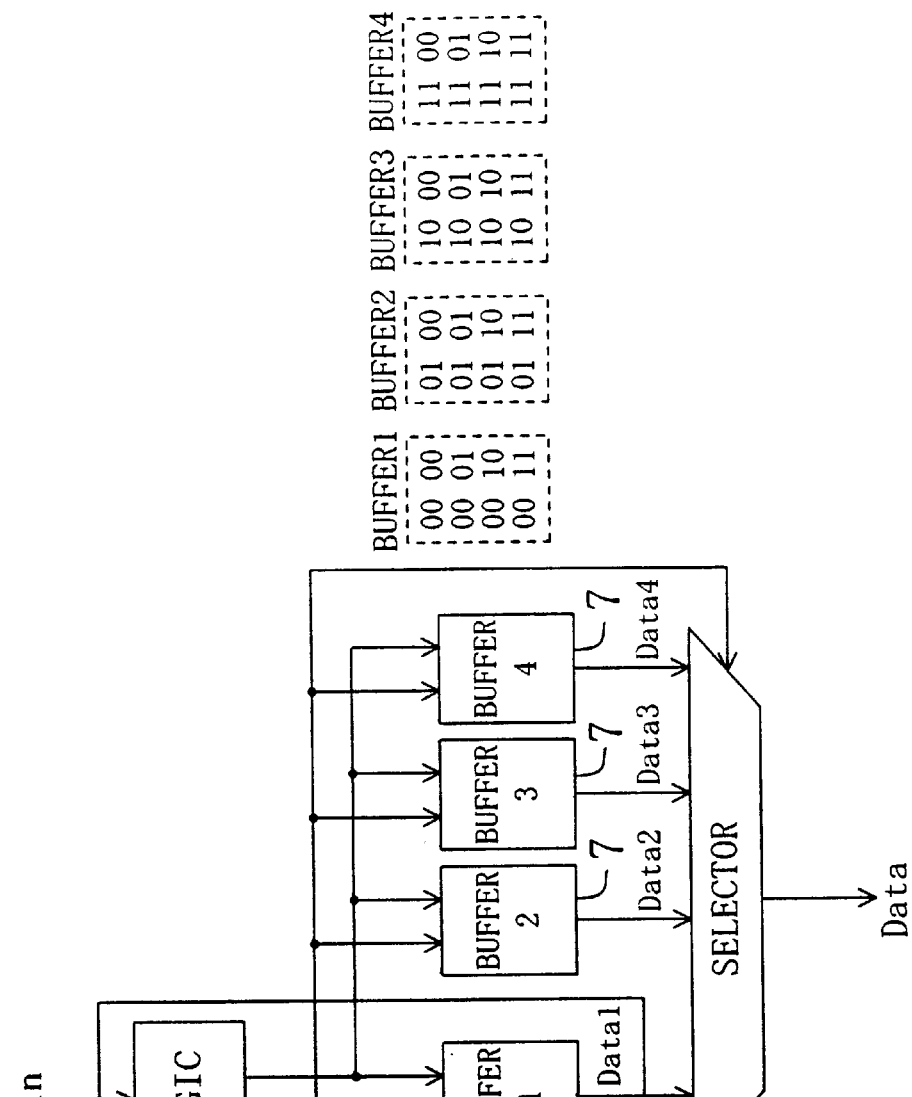
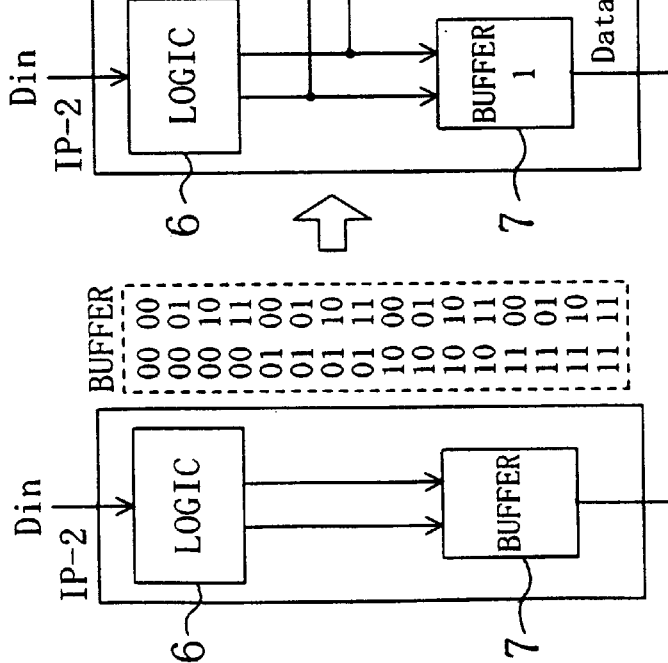

Fig. 18

```
always@( address or data1 or data2 or data3 or data4 ) begin
   case( address[3:2] )
     2'b00 data = data1;
     2'b01 data = data2;
     2'b10 data = data3;
     2'b11 data = data4;
   endcase
end
```

4 cycles

Number of cycles 5 cycles

P2a Speed:4、Area:140、Power consumption:1867

P2b Speed:5、Area:100、Power consumption:800

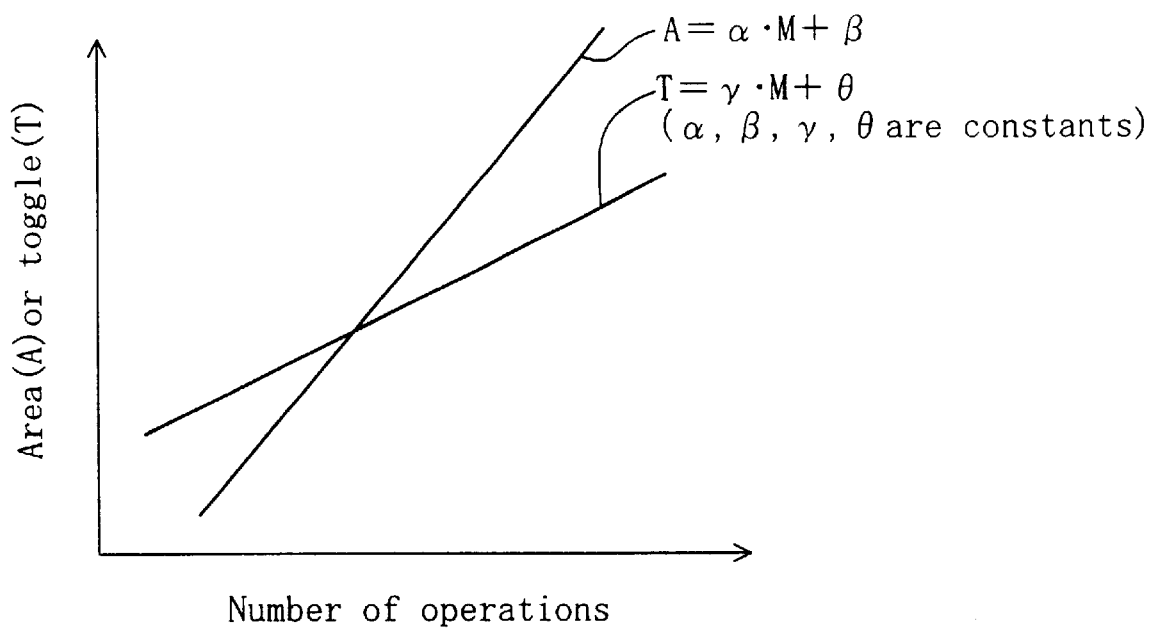

Fig. 28

|    | Number of operations | Area | Number of toggles | Power consumption ($q \cdot V^2 \cdot F$) |
|----|---|---|---|---|
| C2 | 64  | 10  | 10 | 100  |
| C2 | 32  | 5   | 5  | 25   |
| A2 | 64  | 50  | 30 | 1500 |
| M2 | 64  | 80  | 50 | 4000 |
| M2 | 32  | 40  | 20 | 800  |
| C3 | 64  | 15  | 5  | 75   |
| C3 | 128 | 40  | 20 | 800  |
| M3 | 128 | 120 | 50 | 6000 |

Fig. 30
Sharing information table
| Function | Element |
|---|---|
| $A2_f$ | A21, A22 |
Fig. 31
P2c-Speed:5、Area:220、Power consumption:630
P3a-Speed:3、Area:380、Power consumption:4700
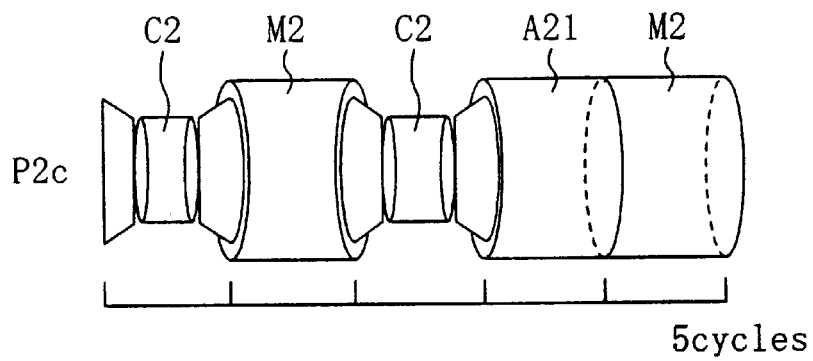
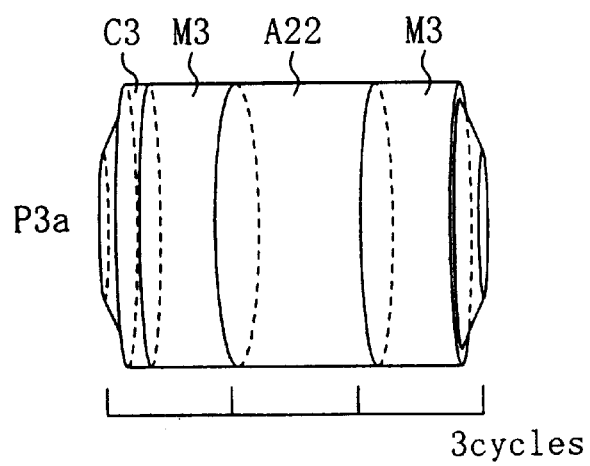

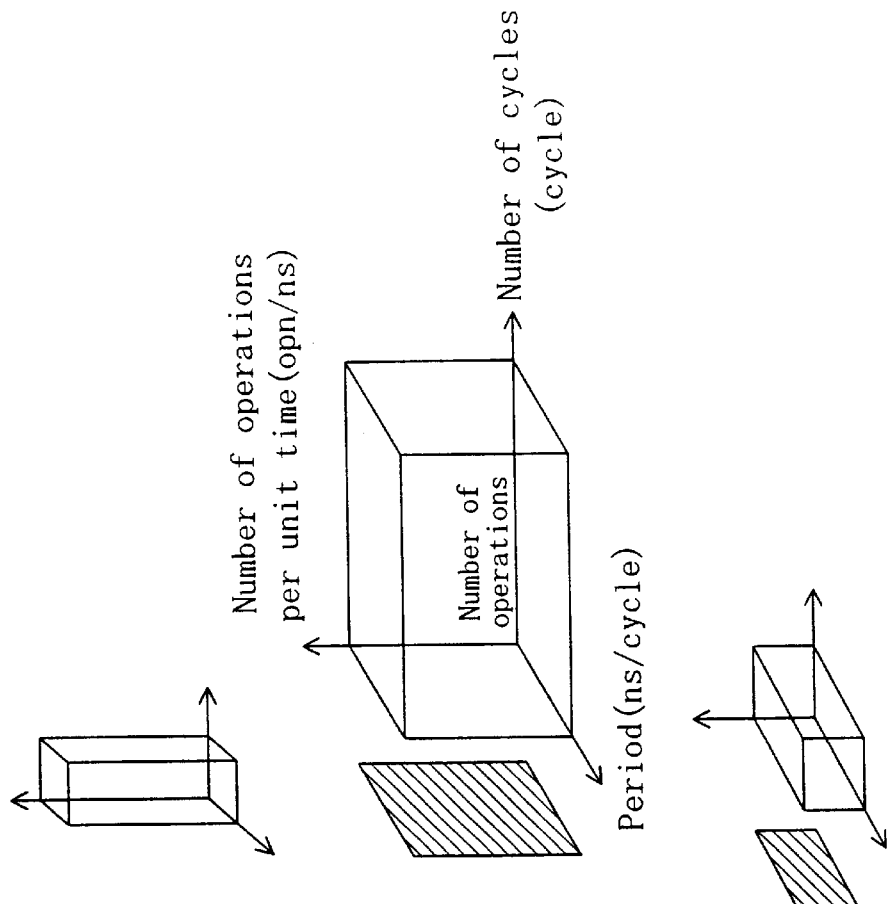

Fig. 36(a)
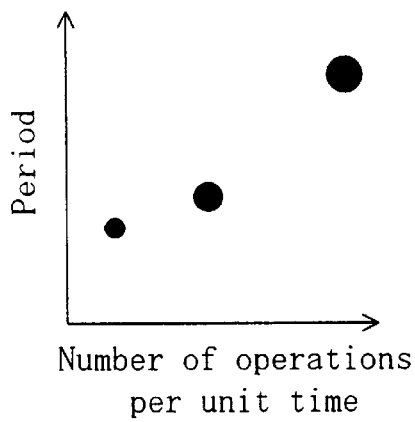
Fig. 36(b)
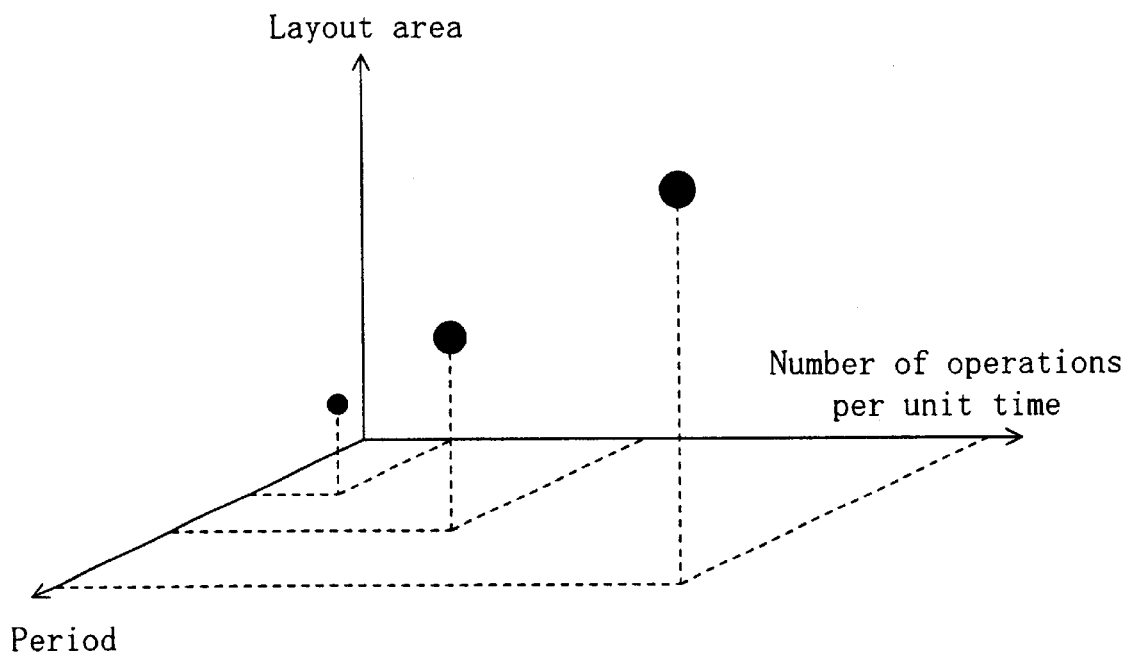

Fig. 37(a)
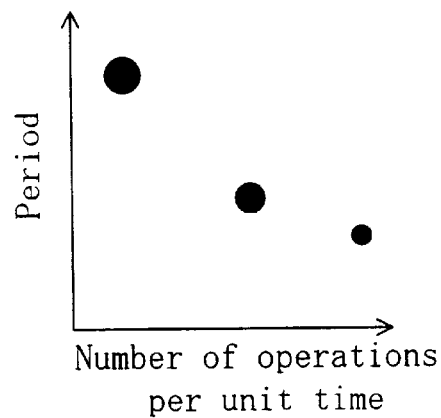
Fig. 37(b)
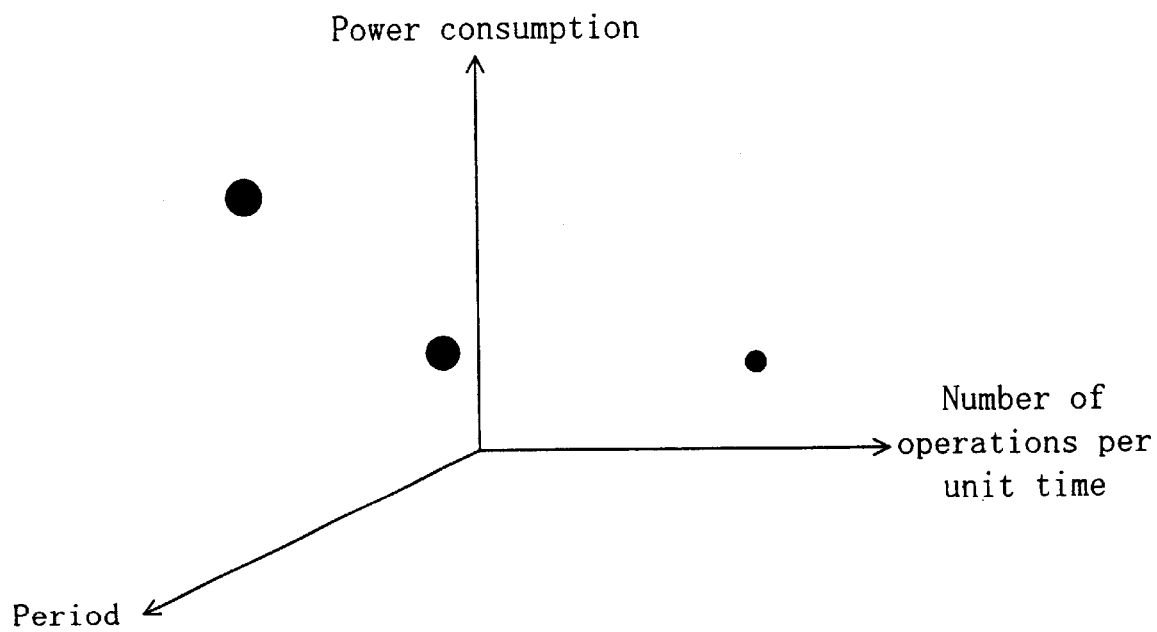

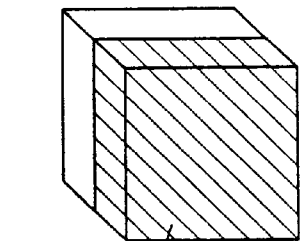
Fig. 38(b)  Fig. 38(c)
A21-T1a   A21-T1b
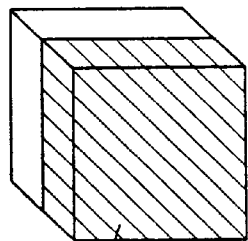
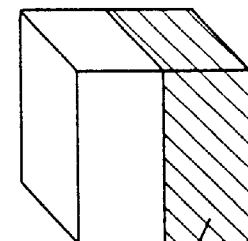
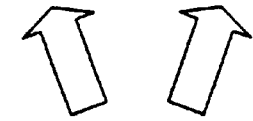
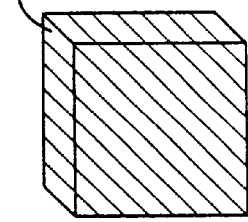
Fig. 38(a)
A21-T1
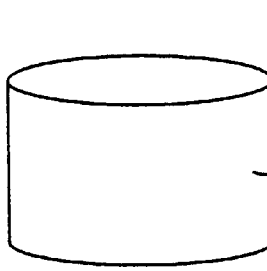
Fig. 38(d)
A23
A23-T1
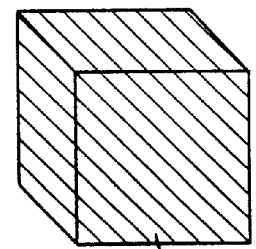
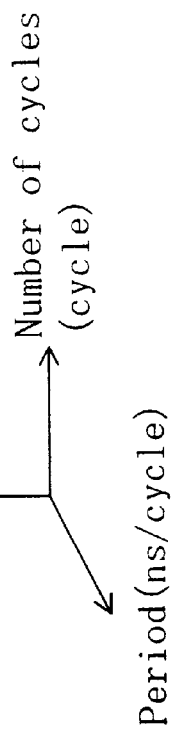
Number of operations per unit time (opn/ns)
Number of cycles (cycle)
Period (ns/cycle)

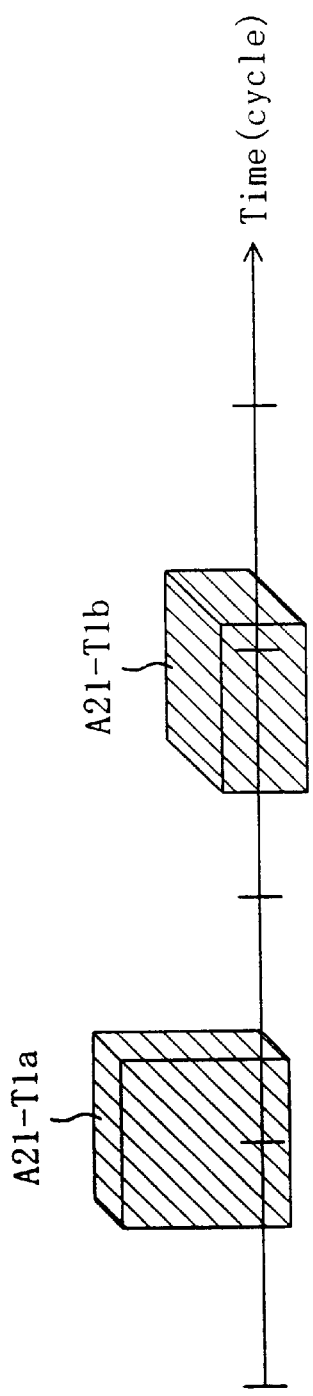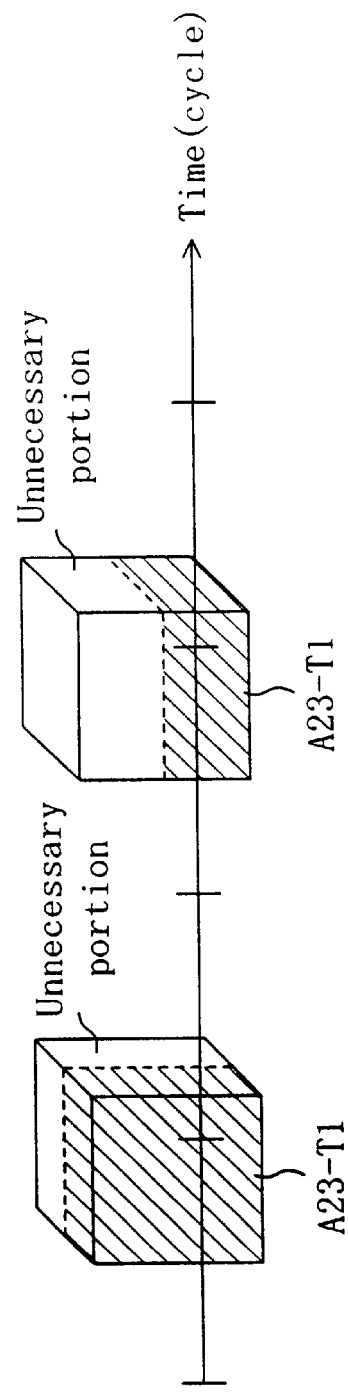

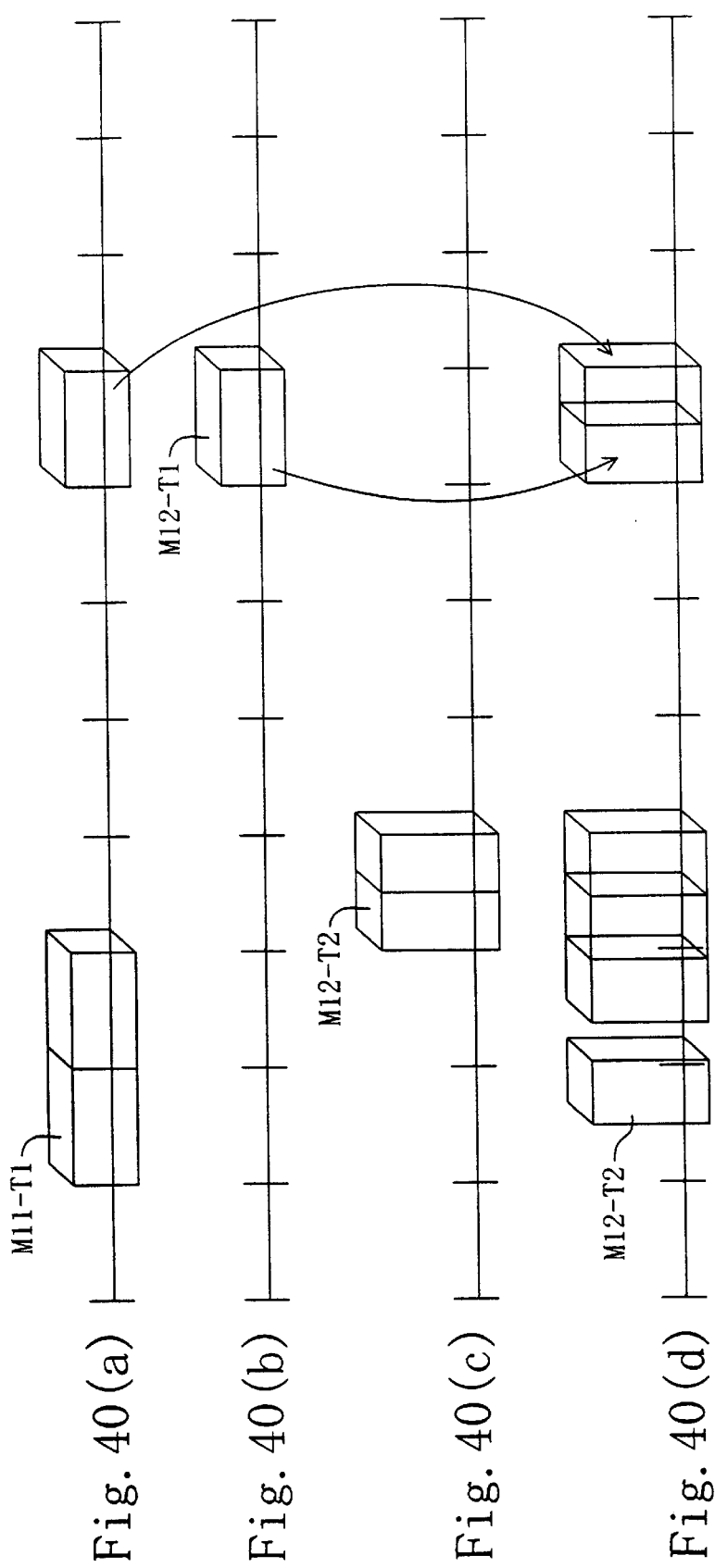

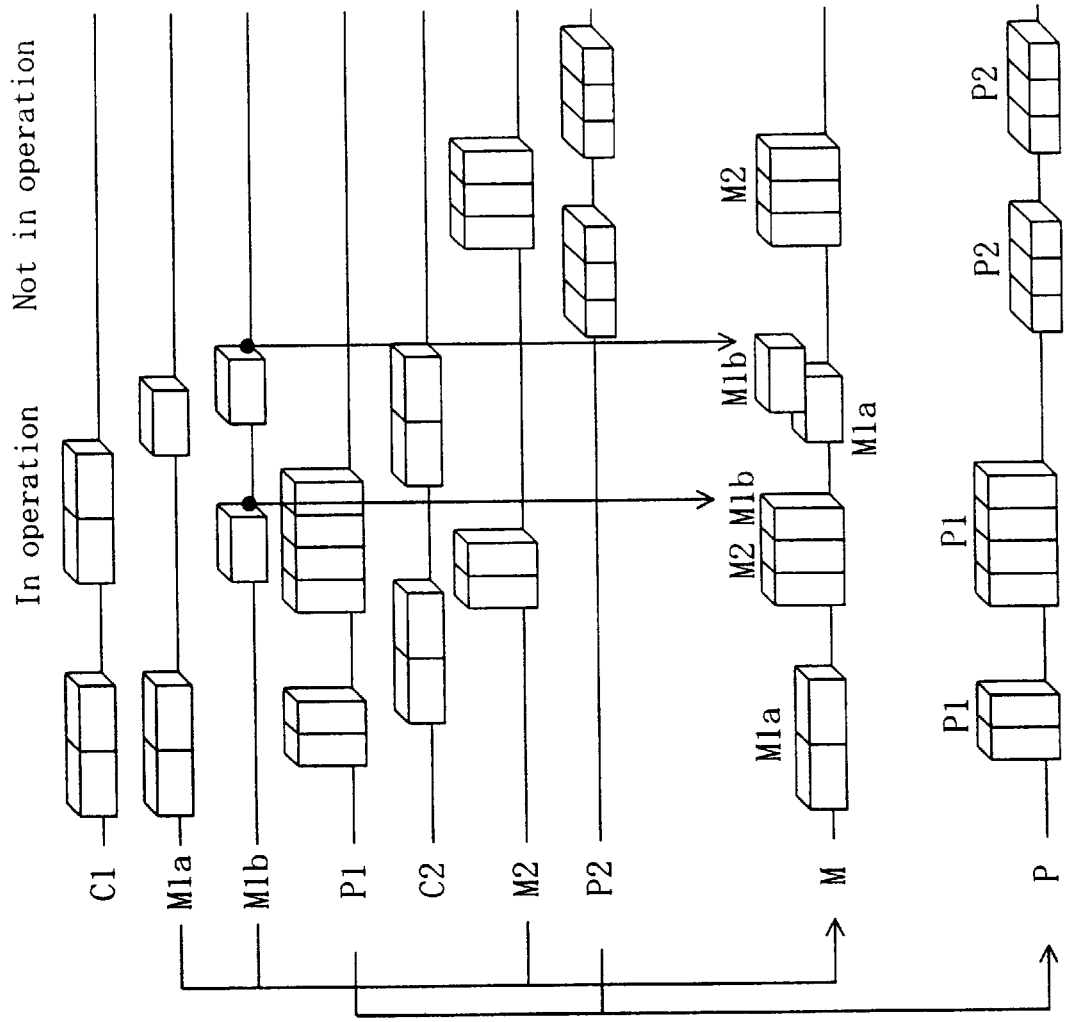
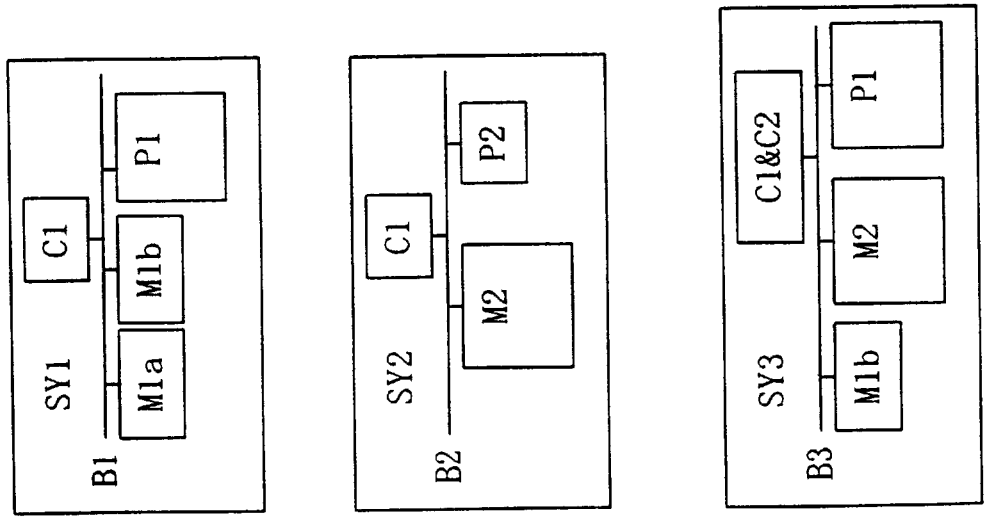
Fig. 41

METHOD OF DESIGNING INTEGRATED CIRCUIT DEVICE USING COMMON PARAMETER AT DIFFERENT DESIGN LEVELS, AND DATABASE THEREOF

BACKGROUND OF THE INVENTION

The present invention relates to design technology for integrated circuit devices such as system LSI, and more particularly, relates to smoothing designing in a sequence of design process steps up to register-transfer level (RTL) design process step.

In general, design of an integrated circuit device is performed in a procedure as shown in FIG. 42, where specification/behavioral level design (S91) comes first followed by RTL design (S92), gate level design (S93), and mask level design (S94) in this order.

In the specification/behavioral level design, specifications and behavior for implementing a certain function are designed. In the RTL design, data throughput and the time required for processing data, as well as hardware configuration and the area occupied by the hardware, are taken into consideration.

The subsequent designs lower in level than the RTL design have been automated, and therefore design data can be generated without the necessity of manual work.

On the contrary, the upper-level designs including the RTL design have been little automated. Design and optimization are performed by skilled designers. Local optimization is therefore difficult due to restriction on the number of steps and the like, and thus only broad-perspective optimization has been made. If local optimization can be done in the upper-level designs, a great effect may possibly be exerted on the entire design. In consideration of this, a simple and convenient optimization design method has been desired.

Conventionally, there has been established no standard information style exchangeable between the specification/behavioral level design and the RTL design. Accordingly, it is impossible to correctly grasp information on the RTL design at the stage of the specification/behavioral level design. For this reason, even a skilled designer tends to prepare, at the stage of the specification/behavioral level design, a design unable to be implemented in the RTL design. As a result, it may become necessary to correct the specification/behavioral level design after completion of the RTL design. Otherwise, a redundant circuit may be designed at the specification/behavioral level.

SUMMARY OF THE INVENTION

An object of the present invention is providing a method and an apparatus for designing an integrated circuit device, capable of designing a large-scale system such as system LCI efficiently by use of common information of the number of operations that is shared in the specification/behavioral level design process step and the RTL design process step, and capable of performing simple and convenient optimization design in these design process steps.

The first method for designing an integrated circuit device of the present invention is a method including representing a portion constituting the integrated circuit device by a three-dimensional shape, the type of the three-dimensional shape being determined depending on a design level.

By the above method, the structure of an element or a bus that is sequentially concretized in the course of specification level—behavioral level—RTL can be represented by three-dimensional shapes that allow for prompt grasp of the structure. This contributes to improvement in design efficiency. More specifically, since it is possible to roughly grasp the structure of an element or a bus in high-level design that is required for design of an integrated circuit device, the structure of a design model can be easily limited to an appropriate range. This reduces the possibility of such an occurrence that high-level design must be done again as a result of low-level design.

When the integrated circuit device has a plurality of functions, the above portion comprises a plurality of elements required for implementing the plurality of functions, and each of the plurality of elements may be represented by a three-dimensional shape of which a volume corresponds to the number of operations required for implementing the function.

In design at a level lower than a specification level, the element may be represented by a pole of which a bottom area corresponds to the number of operations per cycle.

In behavioral level design, the element may be represented by a cylinder of which a bottom is a circle having an area corresponding to the number of operations per cycle.

In RTL design, the element may be represented by a square pole of which a bottom has two adjacent sides corresponding to the number of operations per unit time and the period of a cycle.

When the portion comprises a bus connecting the plurality of elements, a connection relationship between the bus and each of the elements may be represented by a three-dimensional shape so that a structure of the bus and a structure of the element match each other using the number of operations per unit time as a medium.

In design at a level lower than a specification level, the element may be represented by a pole of which a bottom area corresponds to the number of operations per cycle, and the bus may be represented by a pole of which a bottom area corresponds to the number of operations per cycle.

Preferably, in behavioral level design, the element is represented by a cylinder of which a bottom is a circle having an area corresponding to the number of operations per cycle, and the bus is represented by a cylinder of which a bottom is a circle having an area corresponding to the number of operations per cycle.

Preferably, in RTL design, the element is represented by a square pole of which a bottom has two adjacent sides corresponding to the number of operations per unit time and a period of a cycle, and the bus is represented by a square pole of which a bottom has two adjacent sides corresponding to the number of operations per unit time and a period of a cycle.

When the bottom areas of the bus and the element are different from each other, the bus may be represented by a cone of which two faces correspond to the bottoms of the bus and the element.

A bus branch branching from the bus to be connected to the element may further be generated, the bus branch being represented by a pole having a cross-sectional area equal to the bottom area of the bus.

The second method for designing an integrated circuit device of the present invention includes the steps of: (a) obtaining the number of operations by simulating a function of the integrated circuit device; (b) determining specification level elements so that each of the elements has the number of operations equal to or more than the number of operations obtained in the step (a); (c) determining a bus connecting the elements; (d) determining behavioral level elements so that each of the elements has the number of operations per cycle and the number of cycles that give the number of operations equal to or more than the number of operations determined in the step (b); and (e) determining a behavioral level bus for connecting the behavioral level elements based on the number of operations per cycle determined in the step (d).

By the above method, consistent design based on the number of operations of an element and a bus is possible through the respective design stages.

In the step (b), if a plurality of practicable specification level elements exist, one among the elements that has the least number of operations may be determined as the specification level element used for design. With this determination, a circuit small in circuit area and power consumption can be obtained.

In the step (d), in the case where a plurality of practicable behavioral level elements exist, if design is made giving higher priority to operation speed, an element among the behavioral level elements that has the number of operations per cycle as large as possible may be determined as the behavioral level elements used for design, or if design is made giving higher priority to a smaller circuit area or smaller power consumption, an element among the behavioral level elements that has the number of operations per cycle as small as possible may be determined as the behavioral level element used for design. With this determination, it is possible to consider an item of high priority on design in the RTL design.

The integrated circuit device may further include the step of (f) obtaining design data corresponding to the behavioral level element for implementing the function.

In the step (d), a plurality of elements having the same function are preferably unified into a shared element.

In the step (d), in the unification, further preferably, an element among the plurality of elements that has the maximum number of operations per cycle is determined as the shared element.

Preferably, in the step (d), when an element is replaced with the shared element, a portion of the number of operations per cycle of the shared element exceeding the number of operations per cycle of the element to be replaced is not used. This reduces power consumption.

The method may further include the steps of: (g) determining a RTL element so as to have the number of operations per unit time and the period that give the number of operations per cycle equal to or more than the number of operations per cycle of the behavioral level element determined in the step (d); (h) determining a RTL bus based on the number of operations per unit time and the period; and (i) determining design data corresponding to the RTL element for implementing the function. This allows for consistent design of an element and a bus from the specification level through the RTL.

Preferably, in the step (g), in the case where a plurality of RTL practicable elements exist, if design is made giving higher priority to operation speed, an element among the RTL elements that has the number of operations per unit time as large as possible is selected, or if design is made giving higher priority to a smaller circuit area or smaller power consumption, an element among the RTL elements that has the number of operations per unit time as small as possible is selected. With this determination, it is possible to consider an item of high priority on design in the RTL design.

In the step (d), for one specification level element, a plurality of behavioral level elements operating in parallel that have the total number of operations equal to the number of operations of the specification level element may be obtained. This provides flexibility for the layout of a circuit.

The integrated circuit device may execute a plurality of processes in parallel, and in the step (d), if there are behavioral level elements having the same type of function that can be shared among the plurality of processes, the behavioral level elements may be deformed so as to be executed at different times in the respective processes. With this deformation, design allowing for sharing of some circuits and the like is possible in the behavioral level design.

In the step (d), if the time period from completion of operation of a first behavioral level element until start of operation of a second behavioral level element is equal to or more than one cycle, the first behavioral level element may be deformed so that the number of operations per cycle is smaller, to thereby reduce the time period to less than one cycle. Thus, design can be done so that no data retaining circuit is necessary.

In the step (d), if the time period from completion of operation of a first behavioral level element until start of operation of a second behavioral level element is equal to or more than one cycle, a behavioral level element for a circuit that retains output data of the first behavioral level element for the time period may be obtained. In this case, a data retaining circuit of a necessary and sufficient scale is obtained.

In the step (g), RTL elements operating in parallel may be obtained for one behavioral level element. In this case, a RTL model with reduced power consumption is obtained.

In the step (g), RTL elements pipeline-operating sequentially may be obtained for one behavioral level element. In this case, a RTL model with a reduced circuit area is obtained.

In the step (b), processing may be paralleled for reducing the number of cycles required for the processing, and in the step (d), the behavioral level elements operating in parallel may be deformed so that the number of operations per cycle is smaller. This makes it possible to suppress the peak of power consumption without increasing the number of cycles.

In the step (b), each of the specification level elements may be represented by a three-dimensional shape having a volume corresponding to the number of operations of the element. In the step (d), each of the behavioral level elements may be represented by a pole having a cross-sectional area corresponding to the number of operations per cycle of the element and an axial length corresponding to the number of cycles of the element, and in the step (e), the behavioral level bus may be represented by a pole having a cross-sectional area corresponding to the number of operations per cycle of the bus. This makes the design efficient.

In the step (g), each of the RTL elements may be represented by a rectangle pole having a rectangular cross section of which two sides correspond to the number of operations and the period and an axial length corresponding to the number of cycles, and in the step (h), the RTL bus may be represented by a rectangle pole having a rectangular cross section of which two sides correspond to the number of operations and the period. This makes the design further efficient.

The elements may be retrieved from a database storing elements as design data.

The elements may be generated by a generator. This eliminates the necessity of preparing many behavioral models in a database since only a necessary behavioral model needs to be generated.

The design data may be that obtained by use of an IP described to generate: a circuit basic portion; parallel-connected circuit additional portions of the number corresponding to the value of an input parameter; and an adjusting circuit in relation to data input or output of the circuit additional portions. This makes it possible to generate circuits based on one IP, where part of the IP has a scale depending on the parameter.

The circuit basic portion may include: an operator circuit for performing an operation for input data and outputting operation results as well as an address signal designating a destination of the operation results and a data read/write control signal. Each of the circuit additional portions includes a buffer circuit for temporarily storing and then outputting the operation results in accordance with the address signal. The adjusting circuit includes a selection circuit for receiving outputs from the buffer circuits and the data read/write control signal, selecting one of the outputs from the buffer circuits in accordance with the data read/write control signal, and outputting the selected one. This also provides the above effect.

The database of the present invention is a database used for design of an integrated circuit device having a plurality of functions. The database includes: a design model section including specification level elements each having as a design parameter the number of operations required for implementing the plurality of functions, and behavioral level elements each having as design parameters the number of operations per cycle and the number of cycles; and a computation section including a relational expression for calculating the design parameters along the design models.

Having the above database, consistent design can be made for elements for implementing functions required for the integrated circuit device, using the number of operations as a common parameter for the specification level through the behavioral level.

The design model section may further include RTL elements each determined by the number of operations per unit time, the period, and the number of cycles, and the computation section may further include a relational expression for calculating the number of operations per unit time, the period, and the number of cycles from the number of operations and the number of cycles of the behavioral level element. This allows for consistent design extended to the RTL design.

BRIEF DESCRIPTION OF THE DRAWINGS

FIGS. 5(a) through 5(d) are views illustrating guidelines for selecting models at the respective design levels.

FIGS. 9(a) through 9(c) are views illustrating optimization design by sharing an behavioral model in the behavioral level design.

FIGS. 10(a) through 10(g) are views illustrating an example of optimization design performed during the shift from the behavioral level design to the RTL design.

FIG. 11 shows comparison of characteristics among RTL models.

FIGS. 13(a) through 13(h) are views illustrating an example of reliability optimization design performed in the specification level design and the behavioral level design.

FIGS. 16(a) and 16(b) show examples of circuit description for regulating circuits generated by the parameter-provided IP according to the present invention.

FIGS. 17(a) and 17(b) are views illustrating another exemplary case of generating a circuit of a scale corresponding to an input parameter value.

FIG. 18 shows an example of circuit description for a regulating circuit generated by the parameter-provided IP according to the present invention.

FIG. 27 is a view showing the function relationships of the area A and the number of toggles T with the number of operations M.

FIG. 28 shows the values of the layout area A, the number of toggles T, and the power consumption P calculated from function relational expressions in the performance analysis.

FIG. 30 is a view showing an example of a sharing information table in the specification/behavioral optimization design.

FIG. 31 is a view illustrating a specific temporal simulation in the case of using a common resource in the specification/behavioral optimization design.

FIGS. 34(a) through 34(c) are views illustrating how an element changes during the shift from the behavioral level design to the RTL design.

FIGS. 36(a) and 36(b) are views illustrating a procedure of evaluating the layout area as performance of an element in the RTL.

FIGS. 37(a) and 37(b) are views illustrating a procedure of evaluating the power consumption as performance of an element in the RTL.

FIGS. 38(a) through 38(d) are views illustrating maximization of the cross-sectional area of elements for sharing in the RTL.

FIGS. 39(a) and 39(b) are views illustrating operation before replacement of elements with a shared element and operation after replacement of elements with a shared element.

FIGS. 40(a) through 40(d) are views illustrating processing for sharing involving deformation of three elements.

FIG. 41 is a view illustrating a procedure of generating a new system by integrating already-designed systems.

DESCRIPTION OF THE PREFERRED EMBODIMENTS

Basic Concept of the Invention

Figure 1:
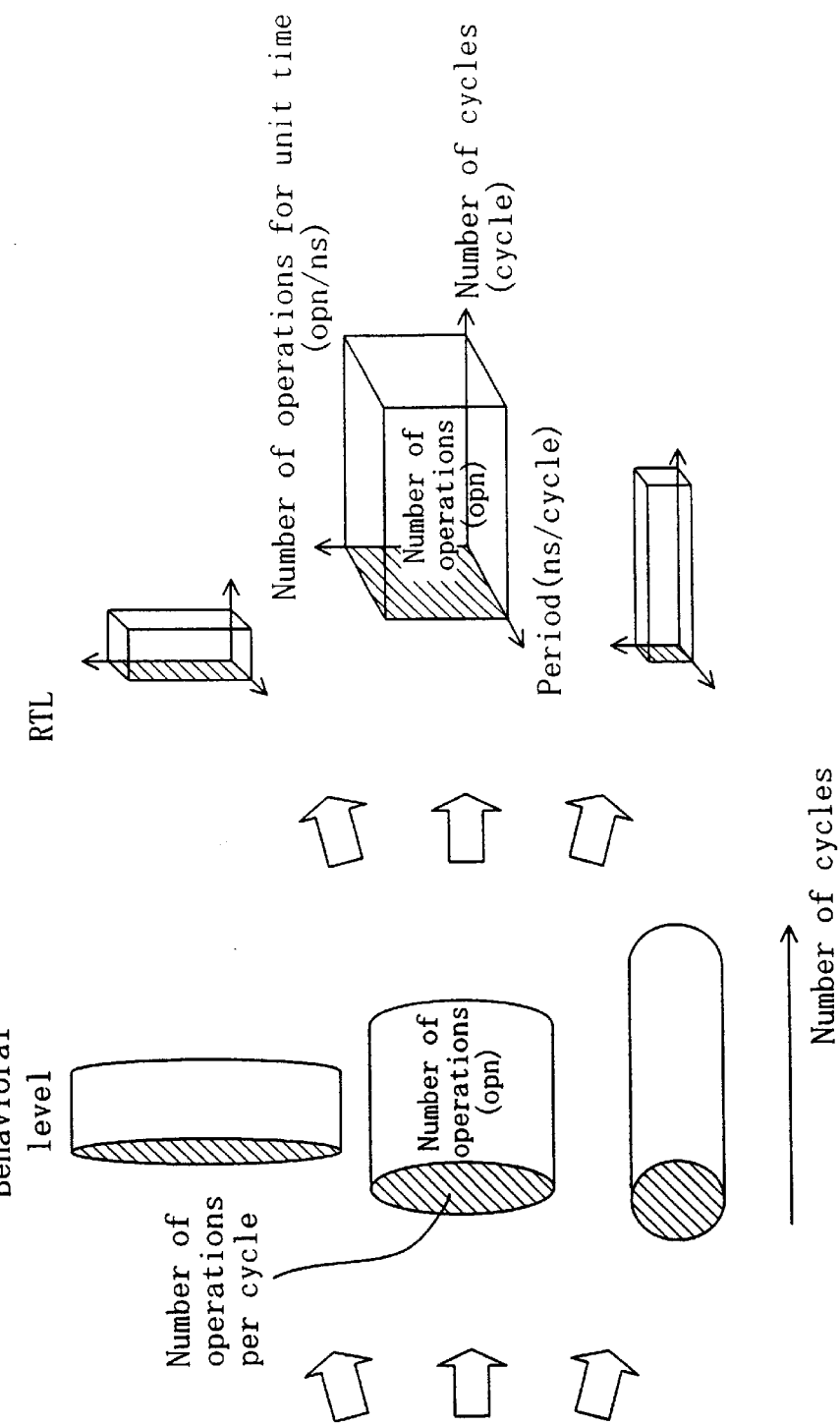
FIG. 1(a) through 1(c) are views illustrating images of elements in the specification level behavioral level, and RT level design.

First, basic concept of the present invention will be described. Herein, in design of an integrated circuit device, a basic technique for utilizing an element (intellectual property (IP); a design asset in the integrated circuit) stored in a database will be described. FIGS. 1(a) through 1(c) are views illustrating images of hardware or software resources handled in the design of an integrated circuit device according to the present invention in the form of graphics.

FIG. 1(a) illustrates an image of an element in the specification level design that is the uppermost-level design in embodiments of the present invention. At this uppermost level, a process to be designed is not yet concretized to such a degree that allows elements or buses to be processed along a quantitative time axis, but merely the throughput required for the process is determined. Each element is represented by an object like a sphere that has a certain volume but is not fixed in shape, and each bus is represented by a line connecting the elements.

The number of operations (hereinafter, referred sometimes to as "opn") of an element corresponds to the volume of the object. Other specific parameters of the element have not yet been determined. The number of operations is a value representing the necessary throughput derived from verification of the specifications. That is, the number of operations represents the amount of processing performed by an integrated circuit device to be designed, including the number of register accesses and the like, as well as the number of function calls, the number of steps in a C source code, and the like in the case of software implementation.

Therefore, from the viewpoint of "the number of operations", the element in the specification level design is like a sphere. When it is desired to retrieve from a database a hardware or software resource that performs certain processing requiring a certain number of operations, an element that performs the processing and has a volume corresponding to a value equal to or more than the number of operations is to be retrieved and utilized. Such an element represented by a sphere is called a specification model. In the relevant drawings, the sphere is depicted as a circle unless otherwise specified. The specification model may otherwise be a cube or a regular octahedron, for example, as long as the volume thereof corresponds to the number of operations.

FIG. 1(b) illustrates images of elements or buses in the behavioral level design that is the intermediate-stage design in the embodiments of the present invention. In this intermediate-stage design, a higher proportion is occupied by the "operation" where an element is being processed along a quantitative time sequence, that is, a time axis. In this intermediate-stage design, therefore, a process is represented by the operation of sequentially executing elements each of which has a function of performing processing having a certain number of operations per cycle along a time axis. Each bus for connecting elements is also required to transmit data corresponding to a certain number of operations per cycle. In the embodiments, therefore, each of elements and buses at the behavioral level is represented by a pole-shaped object having a certain bottom area, such as a cylinder. The bottom area (cross-sectional area) of the cylinder corresponds to the number of operations per cycle, the axial length of the cylinder corresponds to the number of cycles, and, in the case of an element, the volume of the cylinder obtained by multiplying the bottom area by the axial length corresponds to the number of operations. In the case of a bus, the bottom area serving as an indicator for setting the bus width is important. The elements or buses at the behavioral level are not necessarily represented by cylinders, but may be represented by other poles such as regular rectangle poles and regular triangle poles of which the bottom areas (cross-sectional areas) correspond to the number of operations per cycle.

In FIG. 1(b), illustrated are three different types of poles that have the same volume but are different in bottom area and axial length, that is, different in shape. When a hardware or software resource capable of performing certain processing having a certain number of operations is required, a cylindrical element among elements capable of performing the processing that has a volume corresponding to a value equal to or more than the number of operations is to be retrieved and utilized. The length of one cycle may be defined equal to one clock period, for example. Such an element represented by a cylinder is called an behavioral model. In the case of a bus, used is a bus having a bus width satisfying the number of operations per cycle that should be transmitted.

FIG. 1(c) illustrates images of elements or buses in the RTL design that is downstream design in the embodiments of the present invention. In the RTL design, some specific parameters of each element, that is, the number of operations per unit time (hereinafter, the unit time is assumed as 1 ns) (opn/ns) and the length of one cycle (ns/cycle), have been determined. Therefore, each element is represented in a three-dimensional coordinate system with three axes of the number of operations per unit time, the length of one cycle, and the number of cycles. The "cycle" herein corresponds to the period of a clock (or pulse) that is constant. Thus, the time can be represented by the number of cycles. A bus is represented as a plate having a rectangular bottom (cross section) of which two sides correspond to the number of operations per unit time (opn/ns) and the length of one cycle (ns/cycle).

In the embodiments of the present invention, the elements or buses at the RTL level are represented by rectangle poles (or plates). The bottom area (cross-sectional area) of each rectangle pole corresponds to the number of operations per cycle, where the adjacent two sides of the bottom correspond to the number of operations per unit time and the length of one cycle. The axial length of the rectangle pole corresponds to the number of cycles as in the case of the cylinder at the behavioral level. The volume of the rectangle pole obtained by multiplying the bottom area by the axial length corresponds to the number of operations of the element. Therefore, when an element that performs certain processing having a certain number of operations is required in the RTL design, retrieved from a database and utilized is a hardware or software resource, among elements performing the processing, that is represented by a rectangle pole having a volume corresponding to a value equal to or more than the number of operations, under the restriction of, not only the number of cycles, but also the number of operations per unit time and the length of one cycle. In the case of a bus, the bottom area as an indicator for setting the bus width is important. Therefore, used is a plate having a bottom (cross section) equal to or larger than a rectangle of which two sides correspond to the number of operations per unit time (opn/ns) and the length of one cycle (ns/cycle). Such an element or bus represented by a rectangle pole is called a RTL model.

The basic concept of the present invention is to set the number of operations as the common parameter and design an integrated circuit device using a database storing elements and buses corresponding to the parameter at the respective design stages, as shown in FIGS. 1(a) to 1(c). By adopting this design method, the structure of an element or a bus that is sequentially concretized in the course of specification level—behavioral level—RTL can be represented by three-dimensional shapes that allow for prompt grasp of the structure. This contributes to improvement in design efficiency. More specifically, since it is possible to roughly grasp the structure of an element or a bus in high-level design that is required for design of an integrated circuit device, the structure of a design model can be easily limited to an appropriate range. This reduces the possibility of such an occurrence that high-level design must be done again as a result of low-level design.

Embodiment 1

The first embodiment of the present invention will be described with reference to the relevant drawings. First, the flow of design from the specification level through the behavioral level and the RTL to the layout design process step will be described.

Figure 2:
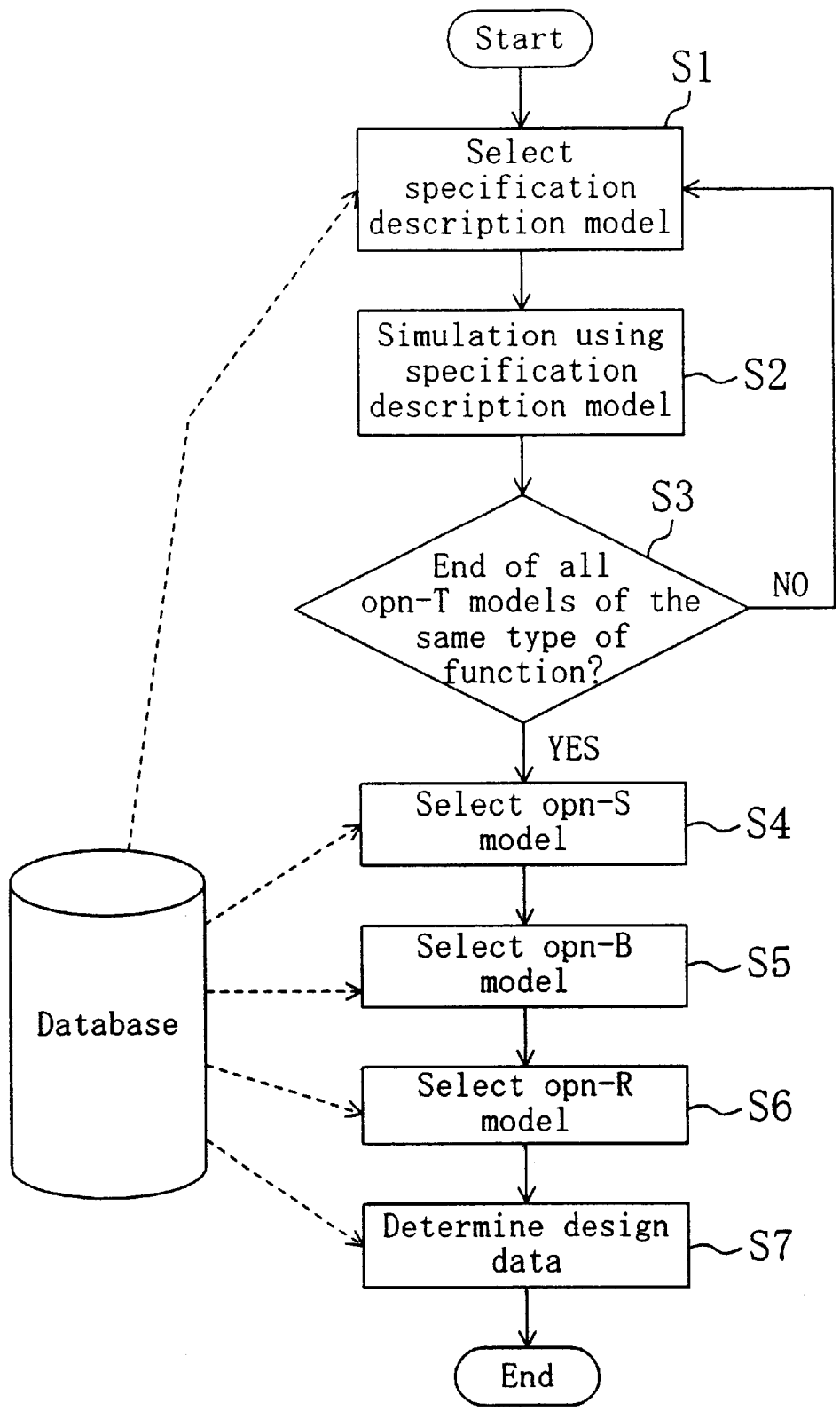
FIG. 2 is a flowchart of a method for designing an integrated circuit device of the present invention.

FIG. 2 is a flowchart of a method for designing an inegrated circuit device of the present invention. In step S1, a specification description model corresponding to a desired function and the amount of data to be processed is selected from a database. The specification description model is a program for function confirmation.

In step S2, a functional simulation is performed using the specification description model, to obtain the number of operations and the processing results of the data to be processed. In step S3, whether or not there exists another specification template model satisfying the same function in the database. If there exists, the process returns to step S1. Otherwise, the process proceeds to step S4. In step S4, one is selected from specification models (opn-S models) corresponding to the numbers of operations obtained based on the specification template models. Steps S1 through S4 correspond to the specification level design.

At Step S5, among behavioral models (opn-B models) at the behavioral level, selected from the database is an behavioral model that has the same number of operations as the selected specification model and has a desired number of cycles and a desired number of operations per cycle. Step S5 corresponds to the behavioral level design.

In step S6, a RTL model (opn-R model) corresponding to the selected behavioral model is selected. In step S7, design data corresponding to the selected RTL model is selected.

When the RTL model is implemented by hardware, as the design data corresponding to the selected RTL model, selected from the database are design data (opn-H) written in a hardware description language at the RTL and a script file (opn-sc) written in a script language for synthesis used during the layout synthesis of the design data When the RTL model is implemented by software, design data (opn-C) written in the C language, for example, is selected from the database as the design data corresponding to the selected RTL model. Steps S6 and S7 correspond the RTL design.

Figure 3:
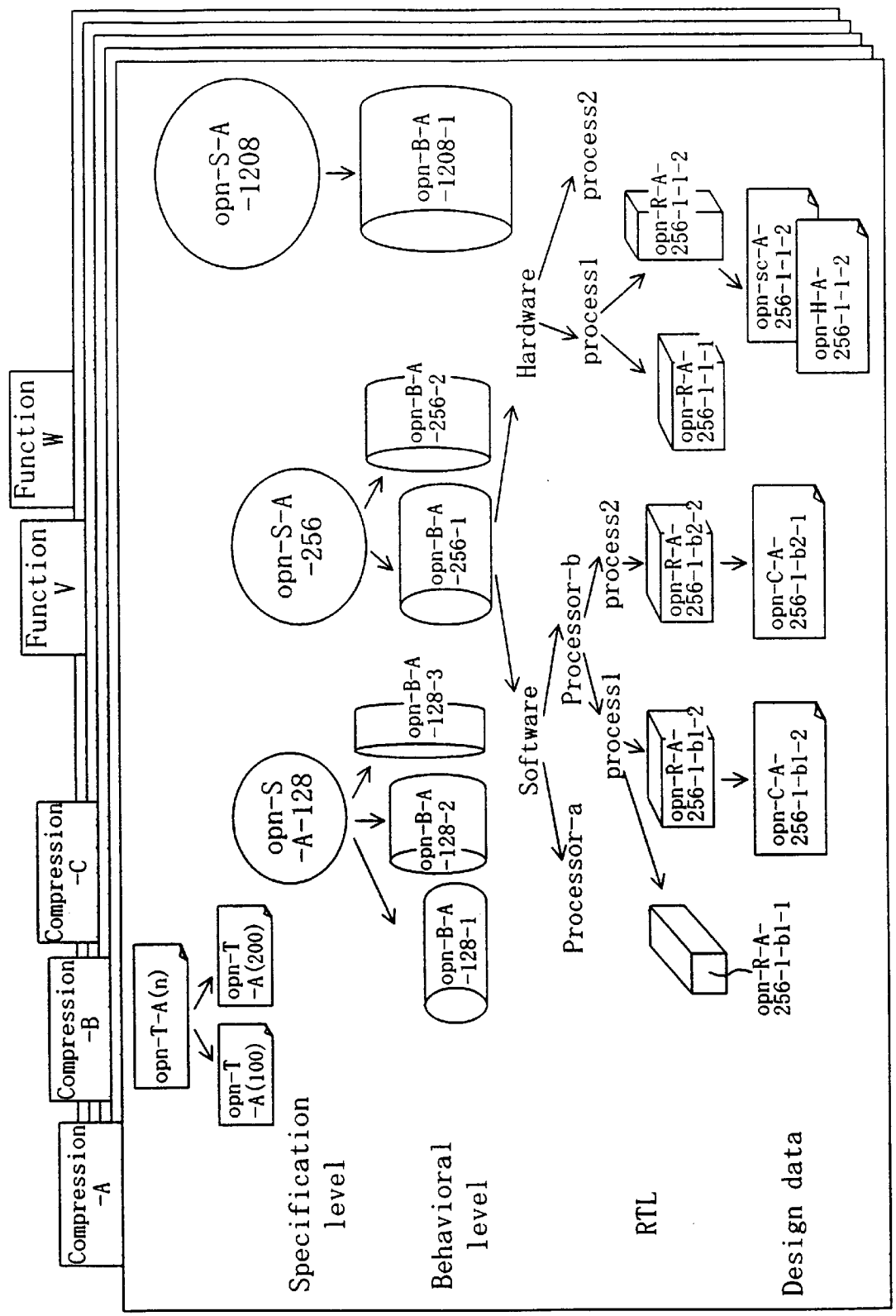
FIG. 3 is a view illustrating a database in EMBODIMENT 1.

Hereinafter, as an example, a case of implementing video data compression function will be described in detail. FIG. 3 is a view illustrating a construction of a database in this embodiment.

The database in this embodiment includes respective models for the specification level, the behavioral level, and the RTL, as well as design data, for various functions implemented by an integrated circuit device to be designed. FIG. 3 indicates that the database in this embodiment includes respective models and design data, not only for compression-A. compression-B, and compression-B having different compression rates, but also for function V, function W, and the like. It should be noted that although the function of compression-A is illustrated in detail in particular, the other functions also have substantially the same construction.

The construction of the database in this embodiment will be described taking the function of compression-A as an example. The database in this embodiment includes a specification template model (opn-T model) for compression A, opn-T-A(n). The specification template model is a source code of a program having the function of compression A. The code is described in the C language, for example, and the data size thereof is undefined. Specification description models have been prepared from the specification template model opn-T-A(n) for some n values by defining the data amount n of data to be processed. In FIG. 3, specification description models where n=100 and 200 are shown.

Further, provided are specification models opn-S-A-128, opn-S-A-256, and opn-S-A-1208 corresponding to the number of operations of 128, 256, and 1208, respectively. The specification models are represented by spheres with the volume thereof corresponding to the number of operations.

The database in this embodiment also includes behavioral models corresponding to the respective specification models. For example, opn-B-A-256-1 and opn-B-A-256-2 are provided for opn-S-A-256. Each of the behavioral models is represented by a cylinder where the number of operations corresponds to the volume of the cylinder, the number of operations per cycle corresponds to the bottom area thereof, and the number of cycles corresponds to the axial length thereof.

The database in this embodiment further includes RTL models corresponding to the respective behavioral models. Each of the RTL models is represented by a rectangle pole where the number of operations corresponds to the volume of the rectangle pole, the number of operations per unit time and the period of the cycle correspond to the adjacent two sides of the bottom thereof, and the number of cycles corresponds to the axial length thereof.

When the function is to be implemented by hardware, the database in this embodiment includes RTL models each specific to a fabrication process adopted for an integrated circuit device to be designed. For example, in FIG. 3, for opn-B-A-256-1, opn-R-A-256-1-b1-1 and opn-R-A-256-1-b1-2 are provided for process 1 (process1). For each of the RTL models, design data (opn-H) written in the hardware description language (HDL) and a script file (opn-sc) are provided. For example, for opn-R-A-256-1-b1-2, opn-H-A-256-1-b1-2 as the HDL-written design data and opn-sc-A-256-1-b1-2 as the script file are provided.

When the function is to be implemented by software, the database in this embodiment includes RTL models each specific to each type of processor executing the software and each fabrication process adopted. This is because the instruction set is different between the processors used, and the operation speed is different between the fabrication process adopted. In FIG. 3, for opn-B-A-256-1, for example, opn-R-A-256-1-b1-1 and opn-R-A-256-1-b1-2 are provided for processor b (processor-b) fabricated in process 1 (process1). For each of the RTL models, design data (opn-C) that is an executable program written in the C language is provided. For example, for opn-R-A-256-1-b1-2, opn-C-A-256-1-b1-2 is provided as the design data.

Figure 4:
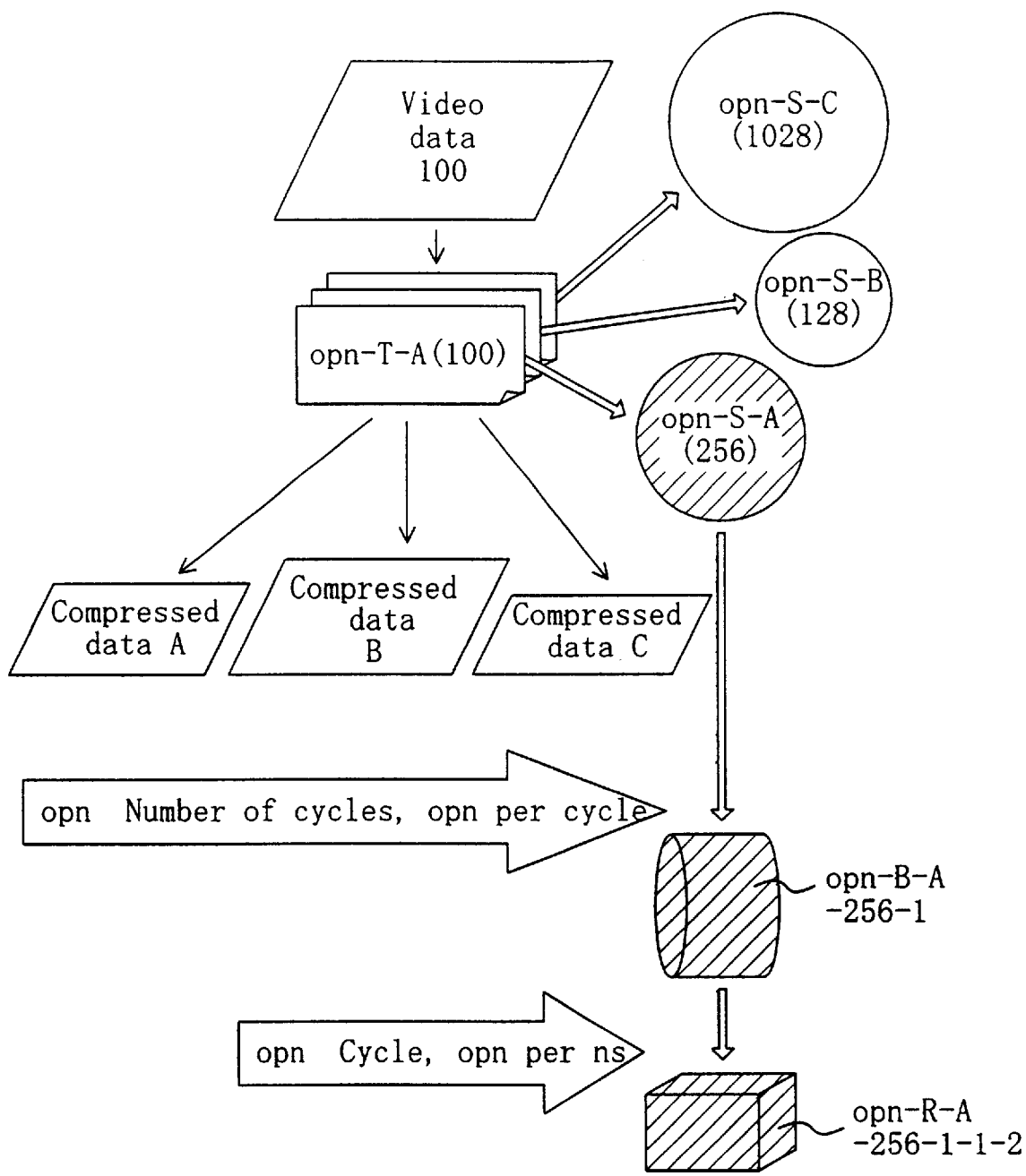
FIG. 4 is a view illustrating a procedure of designing an integrated circuit device for implementing video data compression function using the database of FIG. 3.

FIG. 4 is a view illustrating the procedure of designing an integrated circuit device that implements a video data compression function, using the database shown in FIG. 3. First, the specification level design will be described. The database shown in FIG. 3 includes opn-T-A(n), opn-T-B(n), and opn-T-C(n) as the specification template models for the video data compression function. Assume herein that video data having a data amount of 100 is to be compressed. A specification description model opn-T-A(100) that corresponds to the specification template model opn-T-A(n) having the function of compression-A is then selected from the database.

The executable program, the specification description model opn-T-A(100), is executed by inputting the video data having a data amount of 100 to simulate compression-A. As a result, the number of operations, 256, required for this function and compressed data A are obtained. Based on this number of operations, the specification model opn-S-A-256 is determined as a candidate of the specification model to be selected for compression-A. In FIG. 4, opn-S-A-256 is represented by a sphere having a volume of 256. As the data amount after compression is smaller, the compression rate of the specification model is higher, or the compression precision is lower.

Thereafter, a specification description model opn-T-B (100) corresponding to a specification template model opn-T-B(n) having the function of compression-B that is the same type of function as compression-A, that is, video data compression, is selected from the database. In this case, a specification model opn-S-B-128 as a candidate of the specification model to be selected, as well as compressed data B, are obtained in the manner described above. Likewise, a specification description model opn-T-C(100) corresponding to the specification template model opn-T-C (n) having the function of compression-C is selected from the database, to obtain a specification model opn-S-C-1028 as a candidate of the specification model to be selected, as well as compressed data C.

FIGS. 5(*a*) through 5(*c*) are views illustrating model selection guidelines at the respective design levels. FIG. 5(*a*) shows parameters used as guidelines for model selection at the respective design levels, together with the characteristics of an integrated circuit that vary with the parameters.

At the specification level, the number of operations is one of the selection guidelines. As the number of operations is larger (the volume of the sphere is larger), the circuit area and the power consumption are larger for hardware (HW) implementation, and the program size and resultantly the required ROM size are larger for software (SW) implementation (FIG. 5(*b*)).

At the behavioral level, the number of operations per cycle is one of selection guidelines. As the number of operations per cycle is larger (the bottom area of the cylinder is larger), the circuit area and the power consumption are larger for hardware implementation and the power consumption is larger for software implementation (FIG. 5(*c*)).

At the RTL, the number of operations per unit time (1 ns) is one of selection guidelines. As the number of operations per unit time is larger (the height of the bottom of the rectangular pole is larger), the circuit area and the power consumption are larger for hardware implementation and the power consumption is larger for software implementation (FIG. 5(*d*)).

With reference to the above guidelines, one of the three specification models selected from the database is selected. Assume that the amount of compressed data is smaller in the order of compressed data C, compressed data A, and compressed data B. From the viewpoint of the number of operations, it is desirable to select opn-S-B-128, which is however largest in the amount of compressed data among the three. From the viewpoint of the amount of compressed data, it is desirable to select opn-S-C-1028, which is however largest in the number of operations among the three specification models.

In the illustrated example, it is determined to select opn-S-A-256 that is middle both in the number of operations and the amount of compressed data. The processing up to this selection corresponds to steps S1 through S4 in FIG. 2.

Next, the behavioral level design will be described. As the behavioral models registered in the database shown in FIG. 3 that implement opn-S-A-256, there exist two models, opn-B-A-256-1 (number of operations per cycle: 64, number of cycle: 4) and opn-B-A-256-2 (number of operations per cycle: 128, number of cycle: 2). One is selected from these two behavioral models based on the number of operations per cycle or the number of cycles required for execution of the model. Herein, assume that opn-B-A-256-1 that is smaller in the number of operations per cycle is selected to prevent the circuit area from becoming large. This processing corresponds to step S4 in FIG. 2.

The RTL design will be described. The selected behavioral model can be implemented either by hardware or software.

As the RTL models registered in the database shown in FIG. 3 that implement the selected behavioral model by software, there exist two models, opn-R-A-256-1-b1-1 (number of operations per ns: 4, cycle period: 16 ns) and opn-R-A256-1-b1-2 (number of operations per ns: 8, cycle period: 8 ns), using processor b (processor-b) fabricated in process 1 (process1). There also exists a model, opn-R-A-256-1-b2-2 (number of operations per ns: 8, cycle period: 8 ns) using processor b (processor-b) fabricated in process 2 (process2).

As the RTL models that implement the selected behavioral model by hardware, there exist two models, opn-R-A-256-1-b1-1 (number of operations per ns: 11, cycle period: 6 ns) and opn-R-A-256-1-b1-2 (number of operations per ns: 16, cycle period: 4 ns), fabricated in process 1 (process1).

Among the above five RTL models, one is selected based on the number of operations per ns and the cycle period. Herein, assume that the RTL model opn-R-A-256-1-b1-2 is selected that has the largest number of operations per ns and the highest operation speed.

Once opn-R-A-256-1-b1-2 is selected, the HDL-written design data opn-H-A-256-1-b1-2 and the script file opn-sc-A-256-1-b1-2 are selected from the database shown in FIG. 3 as design data corresponding to the RTL model. The above processing corresponds to steps S6 and S7 in FIG. 2.

As described above, models corresponding to the number of operations are selected from the database at the respective stages of the design, that is, at the specification level, the behavioral level, and the RTL. This makes it possible to design an integrated circuit device using the number of operations as a medium.

Embodiment 2

In this embodiment, models corresponding to the respective numbers of operations have not been prepared beforehand in a database, as in EMBODIMENT 1, but a generator that outputs a model and the like as required is used.

Figure 6:
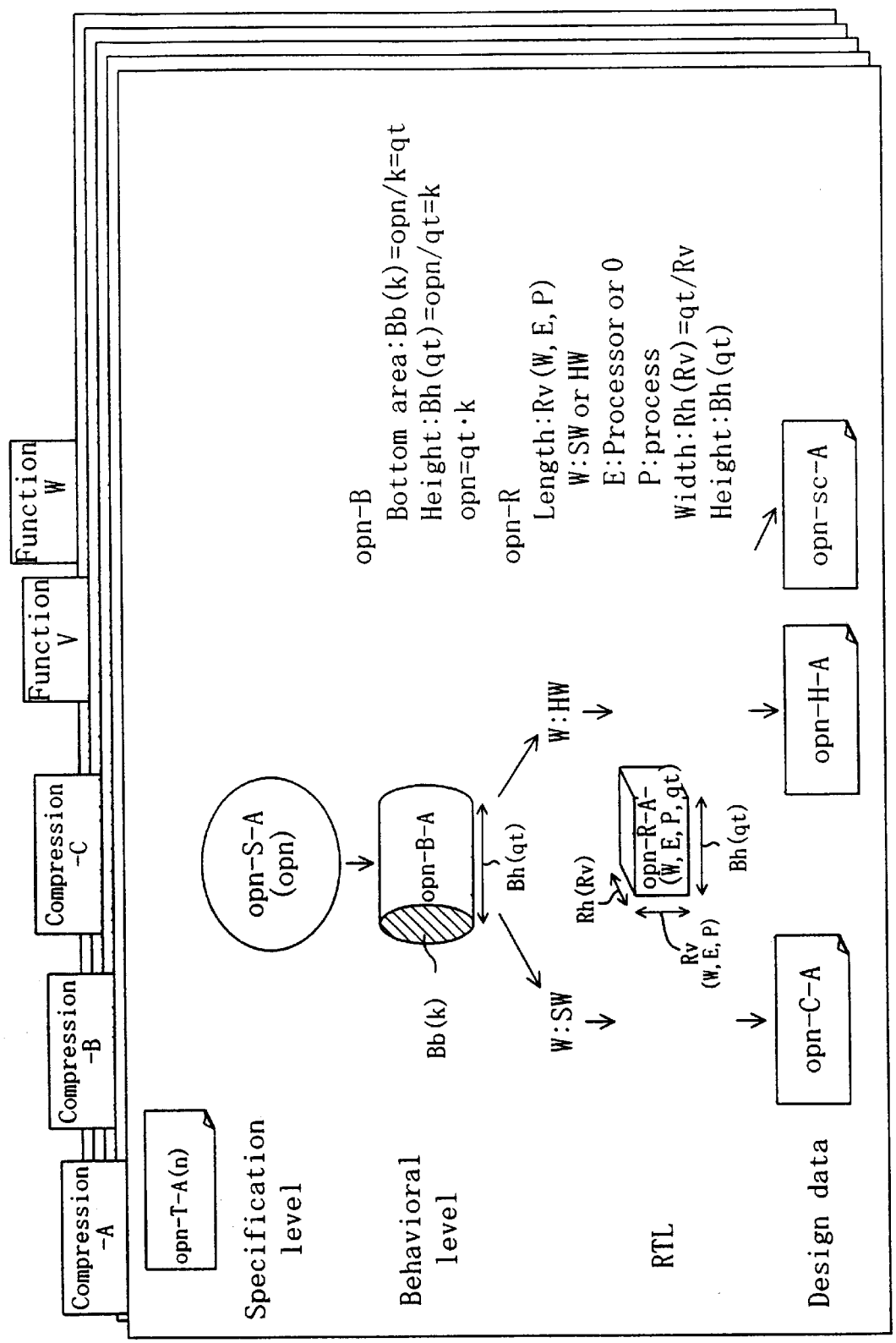
FIG. 6 is a view illustrating a database in EMBODIMENT 2.

FIG. 6 is a view illustrating a database in this embodiment. The database will be described taking the function of compression-A as an example. The database in this embodiment includes opn-T-A(n) as a specification template model. By assigning an amount of video data to be actually processed to the "n" in the specification template model, a specification description model is obtained. The specification description model as an executable program is executed with input of the video data to be actually processed, to simulate compression-A. By this simulation, the number of operations opn required for this function and compressed data are obtained.

As a specification model corresponding to the obtained number of operations opn, opn-S-A(opn) is generated in the database. The opn in the parentheses indicates the number of operations given as an argument. As in EMBODIMENT 1, the specification model is represented by a sphere having a volume corresponding to the number of operations.

An behavioral model corresponding to the above specification model is generated by an behavioral model generator. Upon receipt of the number of operations per cycle qt or the number of cycle k required for execution, the behavioral model generator generates opn-B-A(qt) in the database as an behavioral model corresponding to the specification model opn-S-A(opn). As in EMBODIMENT 1, the behavioral model is represented by a cylinder having a volume corresponding to the number of operations opn and a bottom area corresponding to the number of operations per cycle. The following relationships are therefore established: the bottom area of the cylinder $Bb(k)=opn/k=qt$, the height of the cylinder $Bh(qt)=opn/qt=k$, and the number of operations $opn=qt \cdot k$.

A RTL model corresponding to the above behavioral model is generated by a RTL model generator. As in EMBODIMENT 1, an RTL model is represented by a rectangle pole having a volume corresponding to the number of operations opn, a bottom area corresponding to the number of operations per cycle qt, a length Rv of the bottom (height) corresponding to the number of operations per unit time, and a width Rh of the bottom corresponding to the period of the cycle.

The number of operations per unit time is determined by a value W indicating which is used, software or hardware, for implementation of compression-A, and a value P indicating a fabrication process in the case of using hardware, or values E and P indicating the type of a processor used and a fabrication process for the processor, respectively, in the case of using software. Therefore, the length of the bottom of the rectangle pole is represented by $Rv(W,E,P)$, and the following relationships are established: the width of the bottom $Rh(Rv)=qt/Rv$, and the height of the rectangle pole $Bh(qt)=k$.

Once the above values W, E, and P are input, the RTL model generator generates $opn-R-A(W,E,P,qt)$ in the database as a RTL model corresponding to the behavioral model opn-B-A(qt).

Design data corresponding to the above RTL model is generated by a design data generator. When the value W indicates that compression-A is implemented by software, the design data generator generates C-written design data opn-C-A as an executable program in the database. When the value W indicates that compression-A is implemented by hardware, the design data generator generates HDL-written design data opn-H-A and a script file opn-sc-A in the database.

The database in this embodiment was described taking the function of compression-A as an example. It should be noted that the above description is also applicable to the other functions in the database.

Thus, in this embodiment, it is not required to prepare many models and design data beforehand in the database, but only required to prepare generators for generating models and design data. This significantly reduces the data amount of the database.

The design data generator may otherwise generate design data corresponding to an behavioral model.

The models stored in the database that were used in EMBODIMENT 1 may be generated beforehand using the behavioral model generator, the RTL model generator, and the design data generator used in this embodiment.

Optimization Design Technique

Figure 7:
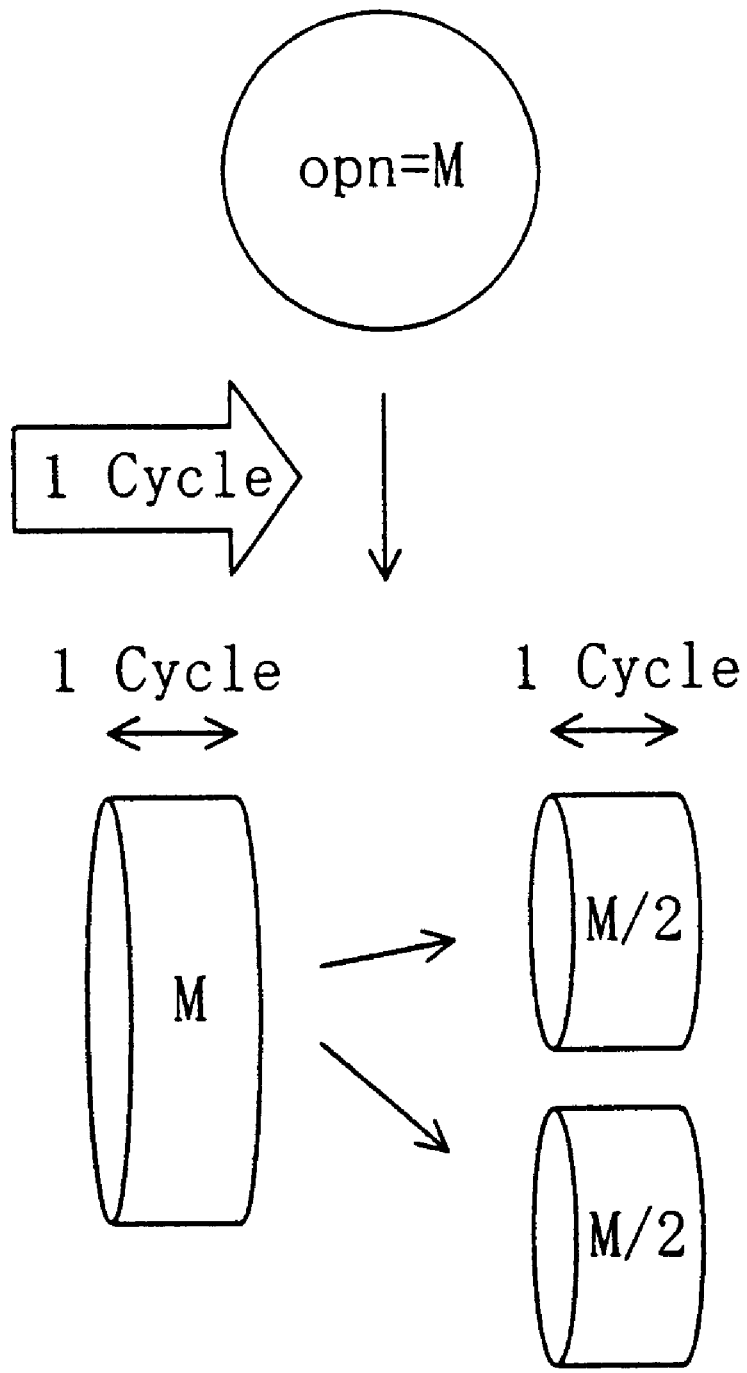
FIG. 7 is a view illustrating an example of optimization design performed during the shift from the specification level design to the behavioral level design.

Hereinafter, an example of optimization design performed using the design method described above will be described.
Optimization Between Specification and Behavioral Levels FIG. 7 is a view illustrating an example of optimization design performed during the shift from the specification level to the behavioral level. Assume that an behavioral model for executing M operations in one cycle is determined based on a specification model having the number of operations of M, as an example. As such an behavioral model, one behavioral model having the number of operations of M may be determined. Alternatively, two behavioral models each having the number of operations of M/2 may be determined and arranged in parallel if the number of operations is considered as a medium.

The above parallel arrangement in the behavioral level design provides effects such that concentration of interconnections is prevented during layout design at a masking level. In addition, layout synthesis is sometimes unavailable when a single behavioral model is used for design. The parallel arrangement can overcome this problem. Further, the parallel arrangement may sometimes provide good results during floor planning.

Parallel arrangement is easy for a multiplier, memory, and the like. In the above example, two identical behavioral models were arranged in parallel. Alternatively, three or more behavioral models may be arranged in parallel, or different behavioral models may be used. In other words, only necessary is that the sum of the numbers of operations of the behavioral models arranged in parallel is equal to or more than the number of operations of the specification model.

As described above, behavioral models in parallel can be obtained by considering only the number of operations.

Optimization at Behavioral Level

Optimization design by sharing an behavioral model in the behavioral level design will be described.

Figure 8:
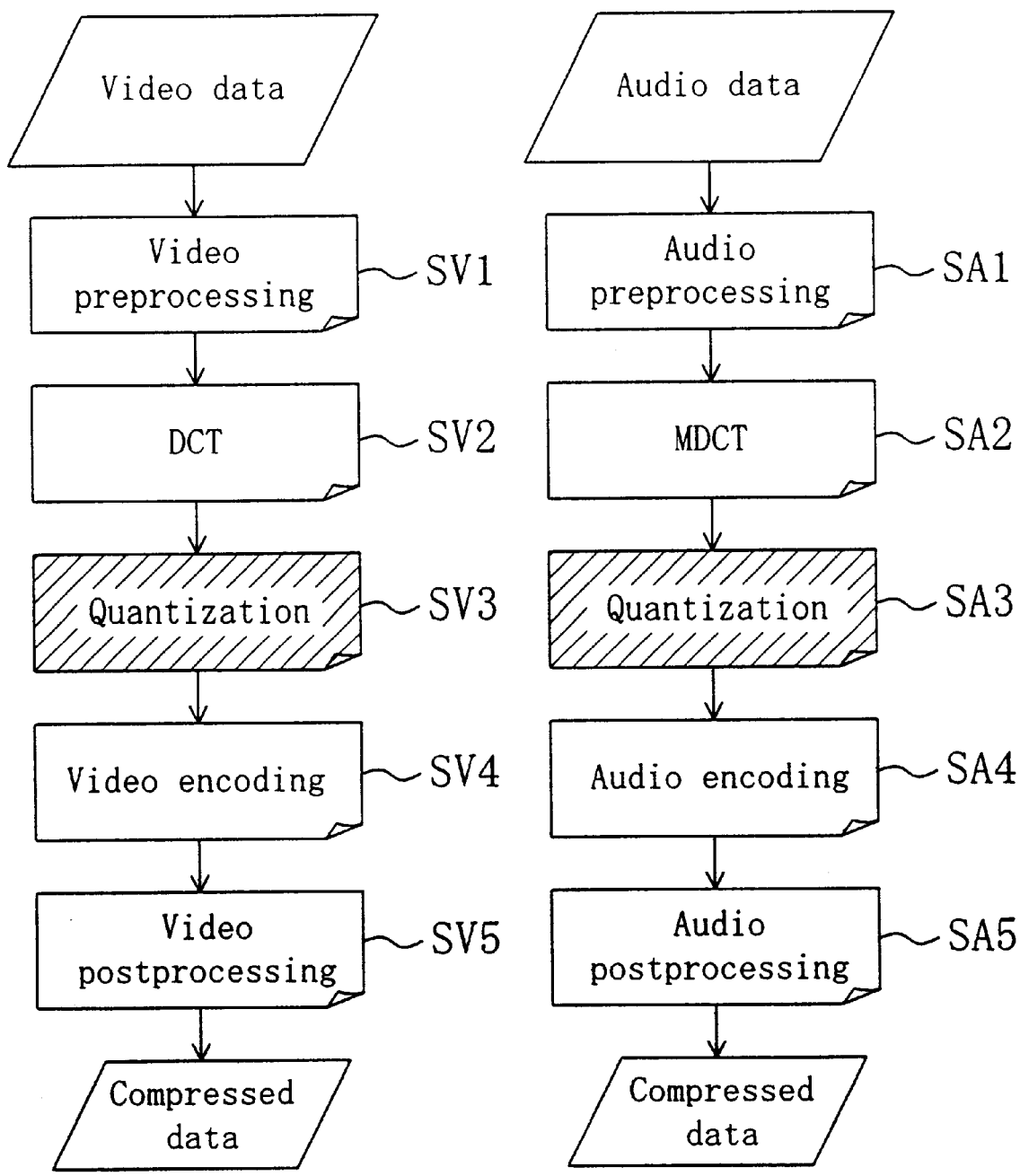
FIG. 8 shows flowcharts for compression of video data and audio data.

FIG. 8 shows flowcharts for compression of video data and audio data. Referring to FIG. 8, video data compresion includes steps of video preprocessing (SV1), discrete cosine transform (DCT) (SV2), quantization (SV3), video encoding (SV4), and video postprocessing (SV5) that are performed in this order, so as to obtain compressed video data. Audio data compression includes steps of audio preprocessing (SA1), modified discrete cosine transform (MDCT) (SA2), quantization (SA3), audio encoding (SA4), and audio postprocessing (SA5) that are performed in this order, so as to obtain compressed audio data.

FIGS. 9(a) through 9(c) illustrate the optimization design by sharing an behavioral model in the behavioral level design. FIG. 9(a) illustrates specification models that execute the respective steps of the video data compression and audio data compression. The number of operations of each of the specification models is represented by the volume of the sphere. The number of operations in this case is the number of computations required for the processing of each step.

FIG. 9(b) illustrates behavioral models corresponding to the specification models shown in FIG. 9(a). Assume that the video data and the audio data are synchronized with each other and that only required is to complete compression of the video data and the corresponding audio data in a predetermined number of cycles.

The processing contents are almost the same between the quantization (SV3) of the video data compression and the quantization (SA3) of the audio data compression, except for the number of operations that is larger in the quantization of the video data compression. It is therefore possible to share the model for quantization between the video data compression and the audio data compression.

FIG. 9(c) illustrates behavioral models after the sharing of the behavioral model for quantization. For sharing, it is necessary to avoid the video quantization and the audio quantization from being performed simultaneously. In the illustrated example, the behavioral models are deformed while each volume is kept unchanged, and it is ensured that the total number of cycles does not increase due to the sharing.

Specifically, the behavioral models for quantization are deformed so that the bottom area (the number of operations per cycle) increases while the volume is kept unchanged, and then the video data quantization is arranged to precede the audio data quantization. In addition, in order to complete the processing within the predetermined number of cycles, the behavioral models for the audio encoding (SA4) and the audio postprocessing (SA5) are deformed so that the axial length of the cylinder (the number of cycles) is reduced compared with that in FIG. 9(b). An behavioral model having a smaller bottom area and a larger axial length contributes to decrease in circuit area and power consumption. Therefore, it is better to reduce the bottom area of an behavioral model if the processing time allows. Thus, the behavioral models for the audio preprocessing (SA1), MDCT (SA2), and the like are deformed so that the bottom area is smaller, whereby the video data compression and the audio data compression are completed just in the predetermined number of cycles.

As described above, sharing of an behavioral model is possible by deforming behavioral models while the respective volumes are kept unchanged. This reduces the circuit area and the like.

Optimization Between Behavioral Level and RTL

Optimization design performed during the shift from the behavioral level design to the RTL design will be described.

FIGS. 10(a) through 10(g) illustrate an example of optimization design performed during the shift from the behavioral level design to the RTL design. Assume that a RTL model corresponding to an behavioral model shown in FIG. 10(a) (number of operations per cycle: 2, number of cycles: 1) is to be obtained. FIG. 10(b) illustrates a RTL model (model A) where the number of operations per unit time is 2 and the length of one cycle is 1 ns. FIG. 10(c) illustrates a RTL model (model B) where the number of operations per unit time is 1 and the length of one cycle is 2 ns. FIG. 18(d) illustrates parallel-operating RTL models (model C). FIG. 10(E) illustrates pipeline-operating RTL models (model D).

Model C is the same in the number of operations and the number of operations per cycle as models A and B, but is larger in the length of one cycle in the model. Accordingly, the number of operations per cycle apparently increases by the degree of parallel arrangement. That is, the number of operations per cycle in model C is double that in model A.

Model D is the same in the number of operations and the number of operations per cycle as models A and B, but the number of cycles apparently increases by the number of pipelines. That is, the number of cycles in model D is double that of model A.

FIG. 10(f) illustrates that model A can be replaced with a model composed of two parallel models each having the number of operations per cycle of 2 and the length of one cycle of 2 ns. For example, as shown in FIG. 10(g), model C outputs two types of signals W1 and W2 having a period of 2 ns. By synthesizing these signals, a signal W3 having the same period of 1 ns as a signal output from model A is obtained.

FIG. 11 compares characteristics among the RTL models. Low-speed model B has an area and power consumption half of those of model A. Paralleled model C has powder consumption half of that of model A. Pipelined model D has a circuit area half of that of model A.

Thus, the RTL models can be optimized in consideration of the area, the speed, the power consumption, and the like.

Inter-function Adjustment at Behavioral Level and RTL

Figure 12C:
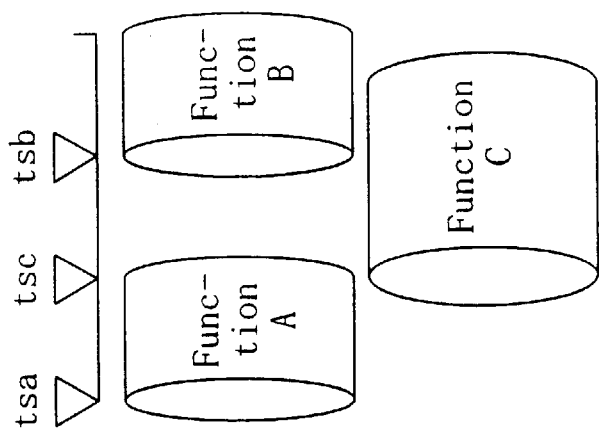
FIGS. 12(a) through 12(e) are views illustrating examples of optimization design performed by inter-function adjustment in the behavioral level design and the RTL design.
Figure 12B:
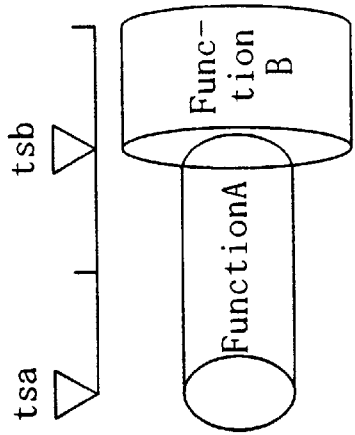
Figure 12E:
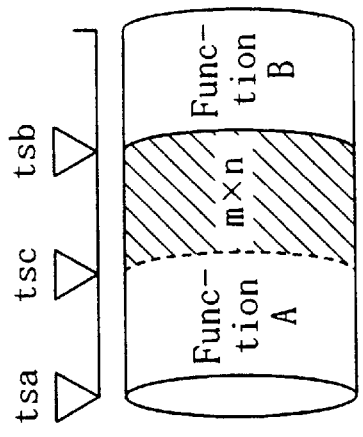
Figure 12A:
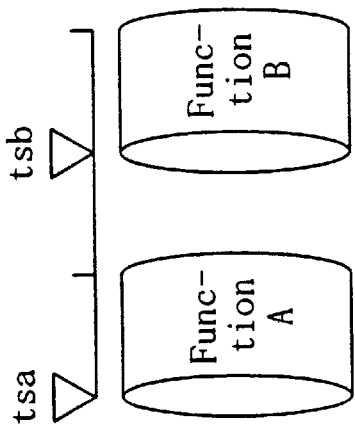

FIGS. 12(a) through 12(e) illustrate examples of optimization design performed by inter-function adjustment in the behavioral level design and the RTL design. The case shown in FIG. 12(a) is as follows. Function A starts processing at time tsa and function B starts processing at time tsb using the processing results of function A as an input. As a result of the behavioral level design, a time gap of one cycle or more exists between the end of the processing of function A and the start of the processing of function B. Having such a time gap, the processing results of function A will be lost, failing to be used by function B.

In order to avoid the above occurrence, an behavioral model for function A is deformed so that the number of operations per cycle is reduced, that is, the number of cycles is increased while the number of operations (volume) is kept unchanged, and thus function B can start processing immediately (within the lapse of one cycle) after the end of processing of function A.

FIG. 12(c) illustrates a case where the processing results of function A are also used by function C that starts processing at time tsc. In this case, a data retaining function is required for terminating the processing of function A by time tsc and retaining the processing results of function A until time tsb.

Figure 12D:
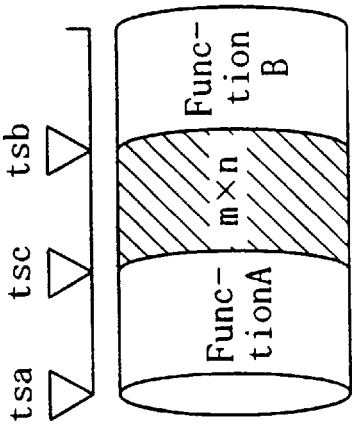

For the above purpose, as shown in FIG. 12(d), the behavioral model for function A is deformed so as to terminate the processing until time tsc, and an behavioral model having a data retaining function is inserted between time tsc and time tsb. The number of operations of the behavioral model having a data retaining function is m×n where m denotes the data amount of the processing results output from function A and n denotes the number of cycles from time tsc until time tsb. The behavioral model having a data retaining function is prepared to be able to generate a RTL circuit that retains m×n pieces of data if the data amount m to be retained and the number of cycles n are given. In the illustrated example, the data retaining function is inserted between the functions A and B. Alternatively, as shown in FIG. 12(e), function A may be provided with the data retaining function.

Reliability Optimization at Specification and Behavioral Levels

FIGS. 13(a) through 13(h) illustrate reliability optimization design performed in the specification level design and the behavioral level design. FIG. 13(a) is a signal flow graph for calculating y=(a+b)*c+d*e. This graph can be changed to parallel multiplication as shown in FIG. 3(b).

FIG. 13(c) represents behavioral models for executing the computation of the graph in FIG. 13(a). Both the multipliers (×) and adders (+) complete computation in one cycle. In consideration of concurrency of the behavioral models, it is found that only one multiplier and one adder are necessary. The computation is completed in three cycles to obtain the value of y. FIG. 13(d) represents behavioral models for executing the computation of the graph in FIG. 13(b). In consideration of concurrency of the behavioral models, it is found that three multipliers and one adder are necessary. The computation is completed in two cycles to obtain the value of y.

Thus, using the behavioral models in FIG. 13(c), a circuit advantageous in area is obtained since the circuit area required is small. Using the behavioral models in FIG. 13(d), a circuit advantageous in speed is obtained since computation is completed in a reduced number of cycles.

The models in FIG. 13(d) may be deformed so that the behavioral model for each multiplier takes two cycles, to obtain behavioral models shown in FIG. 13(e) where computation is completed in three cycles to obtain the value of y. Assume that power consumption of the multiplier is 3 and that of the adder is 2, for example. Since each multiplier in FIG. 13(e) has a speed half of that of the multiplier in FIG. 13(d), the power consumption of the former is 1.5. The peak power consumptions of the behavioral models in FIGS. 13(c), 13(d), and 13(e) are 5, 9, 4.5, respectively, as diagrammatically shown in FIGS. 13(f), 13(g), and 13(h). That is, the behavioral models in FIG. 13(e) can suppress the peak power consumption without sacrificing the speed. By suppressing the peak power consumption, noise and voltage drop can be reduced. Thus, a reliability optimized circuit advantageous in reliability is provided.

Circuit Generation at RTL

An IP that generates RTL description for a circuit of a scale corresponding to the value of an input parameter, that is, a parameter-provided IP will be described. Such an IP is characterized in generating, not only basic circuits of the number corresponding to the parameter, but also regulating circuits in relation to input/output of data of the basic circuits.

Figure 14B:
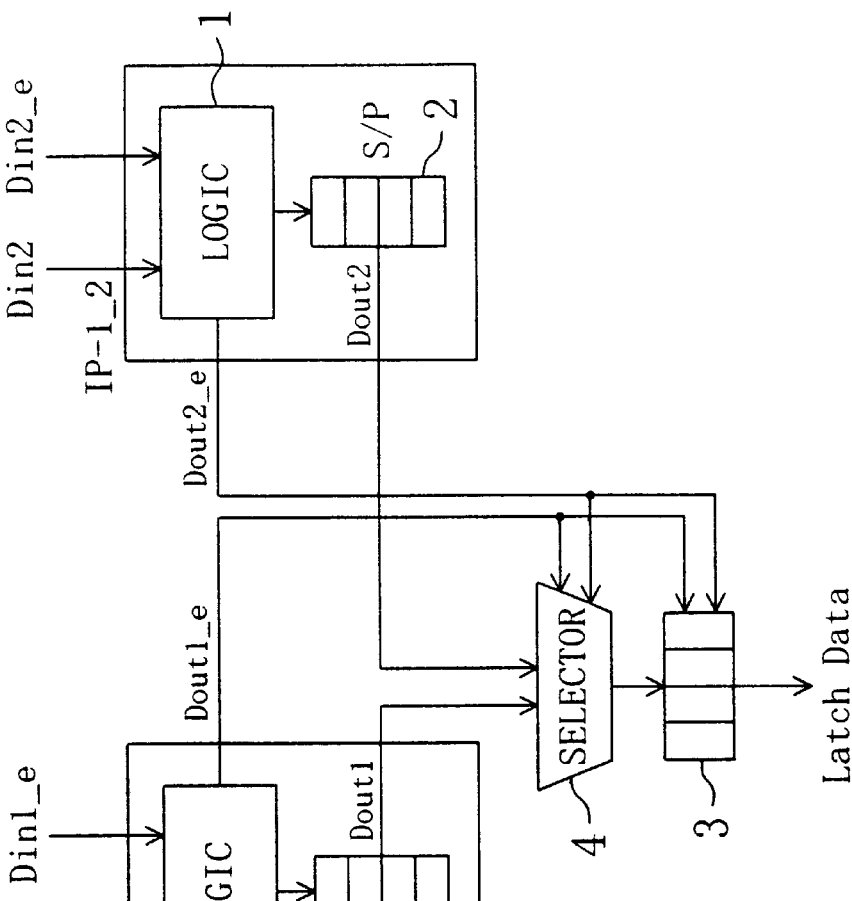
FIGS. 14(a) and 14(b) are views illustrating an exemplary case of generating a circuit of a scale corresponding to an input parameter value.
Figure 14A:
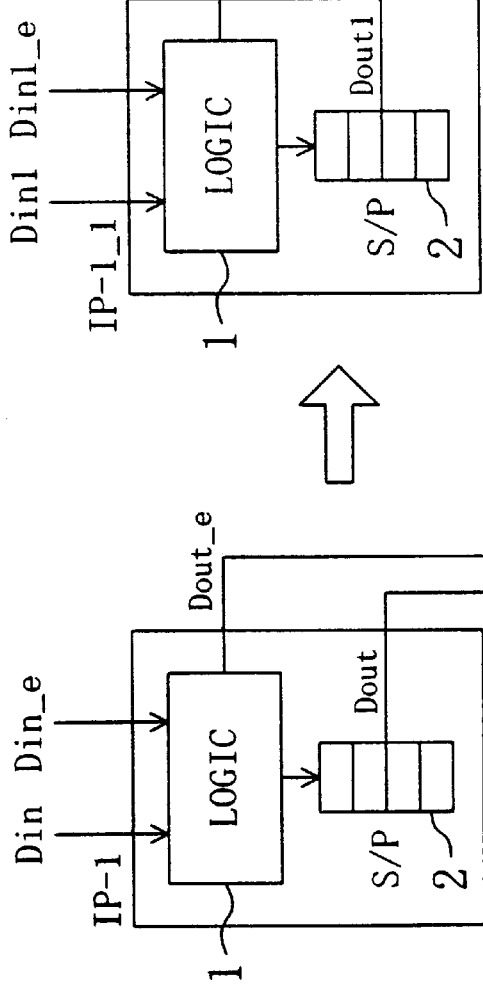

FIGS. 14(a) and 14(b) illustrate an exemplary case of generating a circuit of a scale corresponding to an input parameter value. In FIG. 14(a), a basic circuit IP-1 includes an operation circuit 1 and a serial/parallel conversion circuit 2. The operation circuit 1 receives data Din and an input data enable signal Din_e, and outputs the computation results as serial data and an output data enable signal Dout_e indicating that the output data is effective. The serial/parallel conversion circuit 2 converts the serial data output from the operation circuit 1 to parallel data Dout and outputs the parallel data Dout.

If 1 is given as the parameter, the parameter-provided IP generates the basic circuit IP-1, as well as a latch circuit 3 as the regulating circuit that receives the parallel data Dout and the output data enable signal Dout_e. If 2 is given as the parameter, the IP generates basic circuits IP-1_1 and IP-1_2 that are the same as IP-1, a latch circuit 3, and a selector 4. The selector 4 receives computation results Dout1 and Dout2 of the basic circuits IP-1_1 and IP-1_2, respectively. The selector 4 selects one of output data enable signals Dout1_e and Dout2_e from the basic circuits IP-1_1 and IP-1_2 that indicates that the computation results thereof are effective, selects the computation results of the basic circuit that outputs the selected signal, and outputs the selected computation results to the latch circuit 3.

Figure 15:
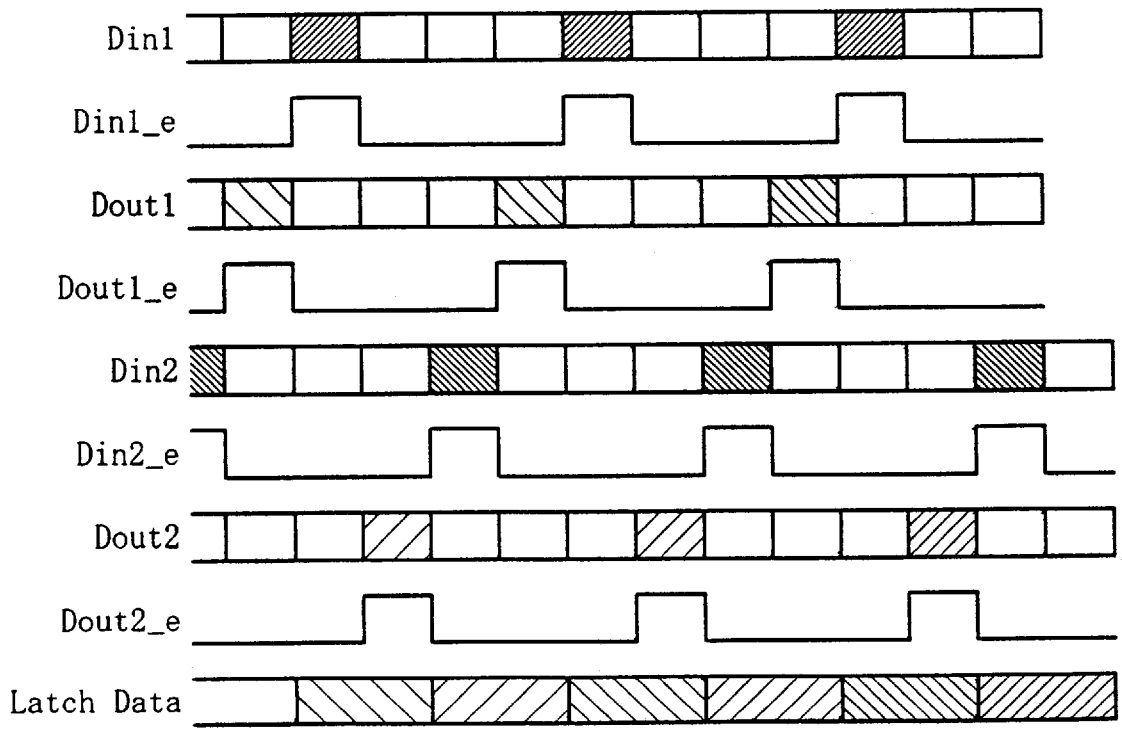
FIG. 15 shows timing charts for the operations of the circuits shown in FIGS. 14(a) and 14(b).

FIGS. 15(a) and 15(b) are timing charts for the operations of the circuits shown in FIGS. 14(a) and 14(b), respectively. In FIG. 15(a), if the clock rises while the input data enable signal Din_e is in a high-potential state ("H"), data Din is received by the operation circuit 1. If the clock rises while the output data enable signal Dout_e is "H", output data Latch Data of the latch 3 is output.

In FIG. 15(b), as in FIG. 15(a), if the clock rises while the input data enable signals Din1_e and Din2_e are "H", data Din1 and Din2 are received by the respective operation circuits 1. The selector 4 selects output data from the basic circuit of which output data enable signal Dout1_e or Dout2_e is "H", and outputs the selected data. The data is then output as output data Latch Data from the latch 3 when the clock rises next.

FIGS. 16(a) and 16(b) show examples of circuit description for regulating circuits generated by the parameter-provided IP as described above. FIG. 16(a) is an example of circuit description written in Verilog generated when 1 is given as the parameter. FIG. 16(b) is an example when 2 is given as the parameter.

The above examples are for the regulating circuit in relation to output. Note that a regulating circuit in relation to input can also be generated in the same manner.

Thus, by use of the parameter-provided IP according to the present invention, not only the basic circuits but also the regulating circuit for regulation between the basic circuits can be simultaneously generated automatically. Therefore, the present invention is particularly effective in generation of design data of a circuit corresponding to parallel-arranged RTL models as described with reference to FIGS. 10(a) through 10(g).

FIGS. 17(a) and 17(b) illustrate another exemplary case of generating a circuit of a scale corresponding to an input parameter value. In FIG. 17(a), a circuit IP-2 includes an operation circuited as a basic part of the circuit and a buffer 7 as an additional part. The operation circuit 6 receives data Din and outputs the computation results and a data read/write control signal. The buffer 7 receives the computation results and the data read/write control signal, and outputs the computation results after temporarily holding the results.

The parameter-provided IP in the above case generates the circuit IP-2 described above if 1 is given as the parameter. If 4 is given as the parameter, the IP generates the circuit IP-2 as well as three buffers 7 and one 4-input selector 8 as a regulating circuit, as shown in FIG. 17(b). The four buffers 7 including the buffer 7 in the circuit IP-2 are connected in parallel and receive the computation results and the data read/write control signal output from the operation circuit. The selector 8 receives outputs from the four buffers 7 and the data read/write control signal output from the operation circuit, selects one of the four inputs from the four buffers 7, and outputs the selected one.

Each of the buffers 7 has a capacity of holding four data units. In a four-bit address of each data unit, the two higher-order bits are used to designate one from the four buffers 7 and the two lower-order bits are used as an address in each buffer 7.

FIG. 18 shows an example of circuit description for a regulating circuit generated by the parameter-provided IP as described above. The example in FIG. 18 is circuit description written in Verilog output when 4 is given as the parameter.

The above example is for the regulating circuit in relation to output. Note that a regulating circuit in relation to input can also be generated in the same manner.

Thus, the parameter-provided IP according to the present invention automatically generates not only the buffers 7 as part of the circuit but also the regulating circuit for selecting one of outputs from the buffers and outputting the selected one. This allows for generation of a circuit including buffers having a capacity corresponding to the parameter value. Therefore, the present invention is particularly effective in generating design data for a data retaining circuit having a specified capacity as described with reference to FIGS. 12(a) through 12(e).

The database in this embodiment may not include RTL models, and design data may directly correspond to behavioral models. Alternatively, such a design method that directly obtains design data based on behavioral models without obtaining RTL models may be adopted.

The method for designing an integrated circuit device in this embodiment can be realized by an apparatus including a computer that can execute a program for implementing the method. Alternatively, the designing method can be realized by recording a program for implementing the method in a computer-readable recording medium and executing the program recorded on the recording medium by means of a computer.

Figure 19:
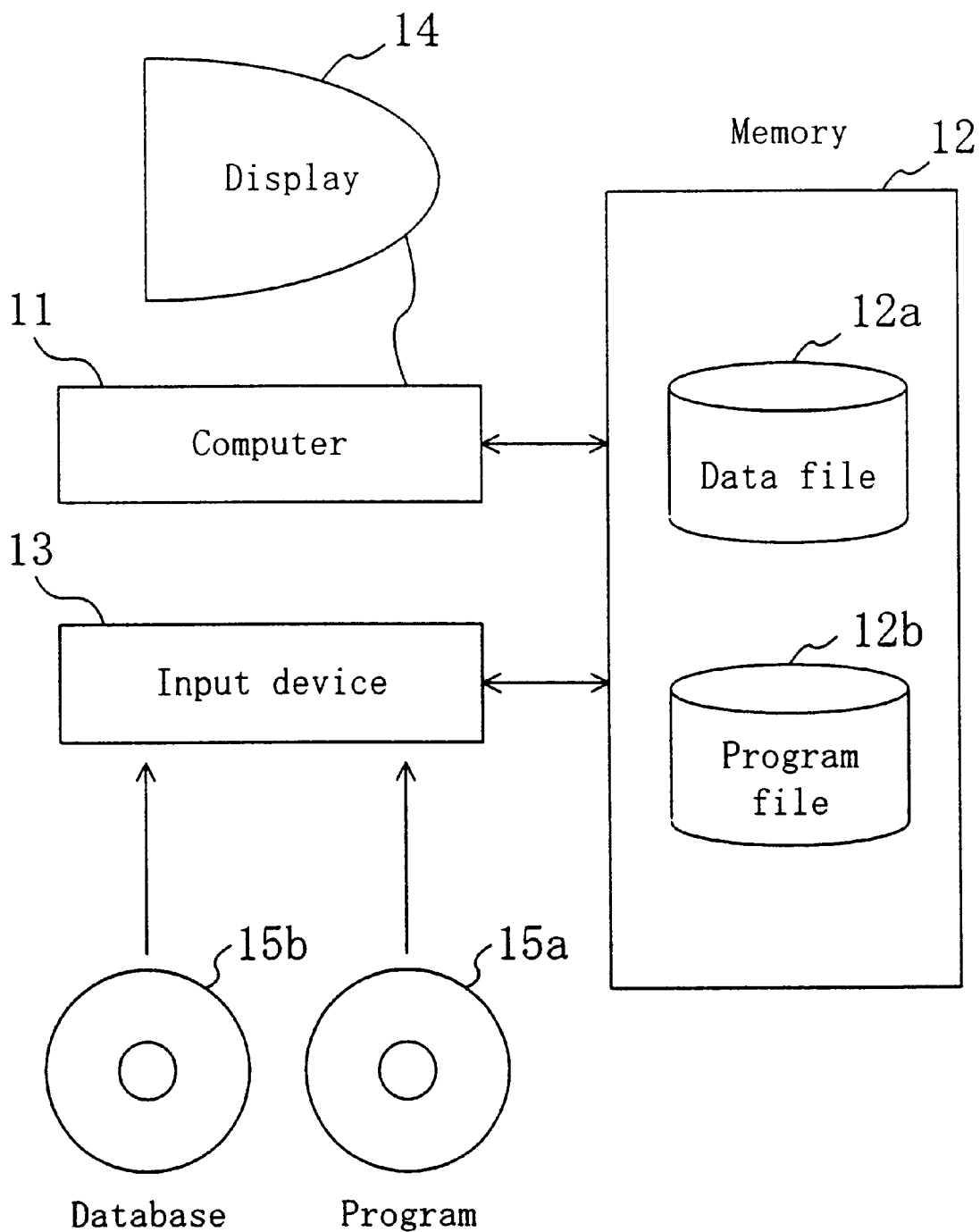
FIG. 19 is a view illustrating implementation of the method for designing an integrated circuit device of an embodiment of the present invention by means of an apparatus provided with a computer.

FIG. 19 illustrates an exemplary construction of an apparatus for designing an integrated circuit device according to the present invention. A computer 11 executes a program for implementing the method for designing an integrated circuit device according to the present invention stored in a program file 12b in a memory 12. The program can be recorded on a computer-readable recording medium such as a CD-ROM 15a. The program recorded on the recording medium can be stored in the memory 12 via an input device 13 and executed by the computer 11. A database according to the present invention can also be recorded on a computer-readable recording medium such as a CD-ROM 15b. The database recorded on the recording medium can be stored in the memory 12 via the input device 13 before the execution of the program.

Embodiment 3

Next, a method for designing not only elements but also a bus structure connecting the elements will be described.

Outline of Design Procedure

Figure 20:
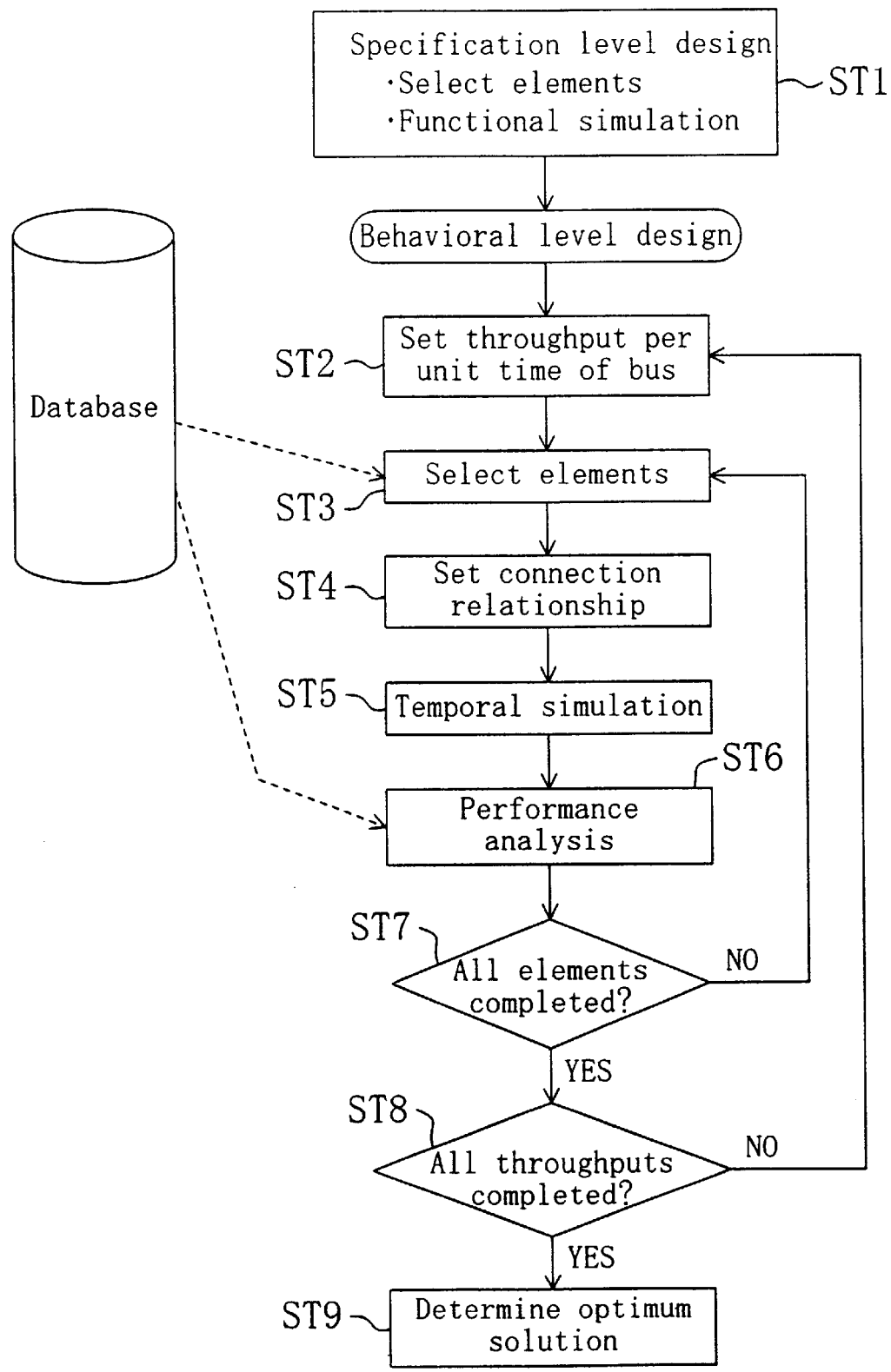
FIG. 20 is a flowchart showing a procedure of the specification/behavioral level design for an integrated circuit device in EMBODIMENT 3.

First, the overall flow of the specification/behavioral level design in the entire design of an integrated circuit device will be described. FIG. 20 is a flowchart showing a procedure of the specification/behavioral level design of an integrated circuit device.

In step ST1, the specification level design is carried out. Specifically, selection of an element, functional simulation, and the like are carried out.

Next, the behavioral level design is started. In step ST2, the number of operations per unit time of a bus, that is, the cross-sectional area of a cylinder is set. In step ST3, cores having desired functions are retrieved from a database and selected as elements. In step ST4, interfaces of the bus, connections between the bus and the elements, and the like are set, to determine the connection relationship between the bus and each of the elements, thereby to be ready for simulation. In step ST5, a temporal simulation is carried out. By this temporal simulation, the number of operations per cycle of each element can be calculated. Once the number of operations per cycle of each element is determined, the shape of the cylinder representing the element is determined. In step ST6, performance analysis is carried out to evaluate the layout area, power consumption, processing speed, and the like of each of the selected elements.

Depending on the determination results in steps ST7 and ST8, the processing in steps ST2 through ST6 may be repeated. Finally, in step ST9, an optimum solution is determined.

The number of operations per cycle, that is, the shape of the cross section of a bus should basically be determined depending on the interface structure with an external apparatus. The reason is that the data amount per second to be transmitted to an external system has already been determined based on the specifications of the external system (e.g., a TV set) in any cases. Data is received from or transmitted to the external system based on the specifications. However, in an internal portion independent of the input/output with the external system, it is possible to freely change the data width and the like without constraints of the interface with the external system. For example, for 36 bit wide data input from an external system, the data width may be reduced to 18 bits inside. By doing this, the layout area can be reduced, although four cycles are required for the processing that will otherwise be completed in two cycles if the 36 bit width is used. As another example, if 36 bit wide data input externally is processed as 72 bit wide data inside, the number of cycles can be reduced, and thus reduction in power consumption is expected.

Hereinafter, specific processing details in the respective steps will be described.

Specification Level Design

Figure 21:
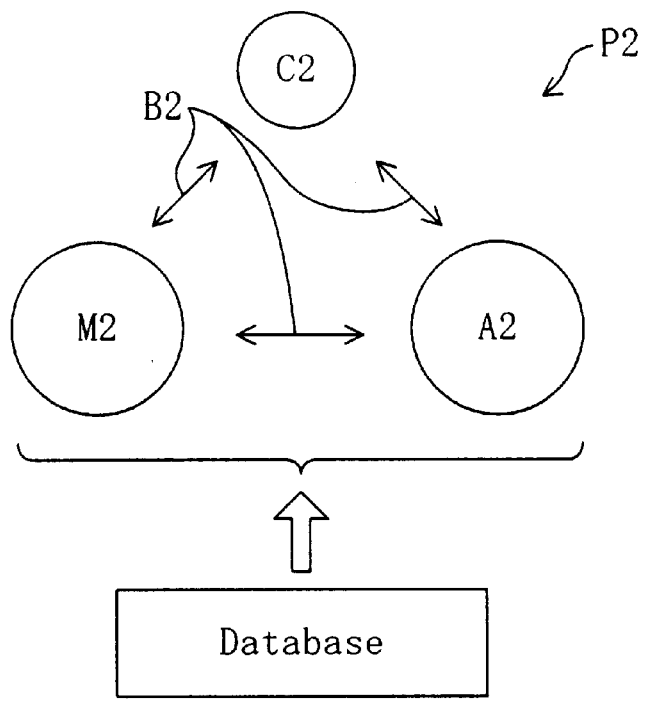
FIG. 21 is a view illustrating the relationship among elements selected in the specification level design for an integrated circuit device in EMBODIMENT 3.

FIG. 21 illustrates the relationship among elements selected at the specification level. In the specification level design, process P2 is composed of elements (C2, M2, A2, and B2). For example, M2 represents a memory, A2 represents an operator, C2 represents a control circuit, and B2 represents a bus. As shown in FIG. 21, B2 presents itself as a path connecting the elements M2, C2, and A2. For the respective elements, hardware resources registered in a database are retrieved and selected as the elements in the following procedure, to perform the specification level design.

Figure 22:
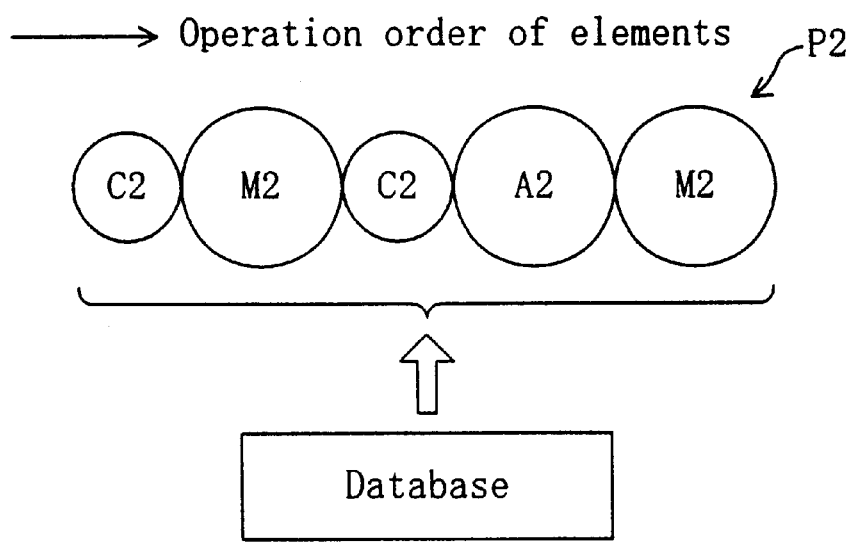
FIG. 22 is a view illustrating the order of operations of the elements in the specification level design for an integrated circuit device in EMBODIMENT 3.

A functional simulation is executed using the selected elements M2, C2, and A2. FIG. 22 illustrates the order of operations of the elements in the specification level. Since the database stores hardware resources (cores) to be used as the elements as described above, cores (C2, M2, and A2) considered to match the specifications of the desired elements are selected from the database and determined as the respective elements. The selected elements (C2, M2, and A2) are connected to the bus B2 as will be described later (see FIG. 23), and a functional simulation in the order of operations as shown in FIG. 22, for example, is executed for confirmation of the functions of the respective elements as well as the connection relationship among the elements.

Behavioral Level Design

Figure 23:
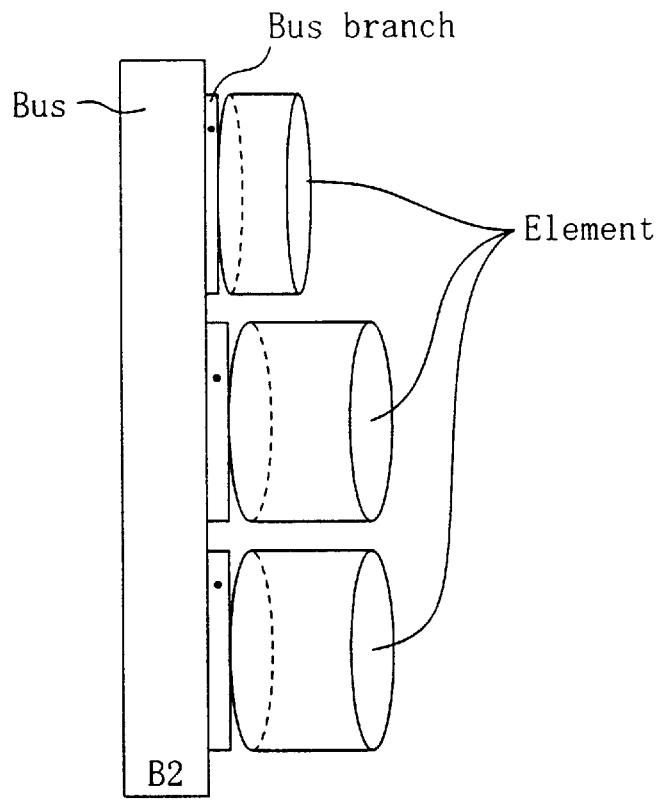
FIG. 23 is a view of a three-dimensional image of the connection relationship between a bus and elements in the behavioral level design for an integrated circuit device in EMBODIMENT 3.

FIG. 23 illustrates a three-dimensional image of the connection relationship between the bus and the elements in the behavioral level. As shown in FIG. 23, a cylindrical bus and bus branches are depicted. The cylindrical bus has a cross-sectional area corresponding to the number of operations per cycle of the bus, and may be regarded as a stretchable cylinder connecting the elements. The bus branches are small cylinders branching from the bus toward the elements and have interfaces for connecting the elements and the bus. That is, the number of operations per cycle handled during input/output of the system is used as a default number of operations, and the bus branch is defined as representing the default number of operations. By using the parameter of "the number of operations per cycle" (hereinafter, called the "interface area" of a bus or the "bottom area" of a cylinder or the like) as a medium, the connection relationships between the bus and the elements are constructed as shown in FIG. 23. The processing described above corresponds to the steps ST2 through ST4 in FIG. 20.

Figure 24:
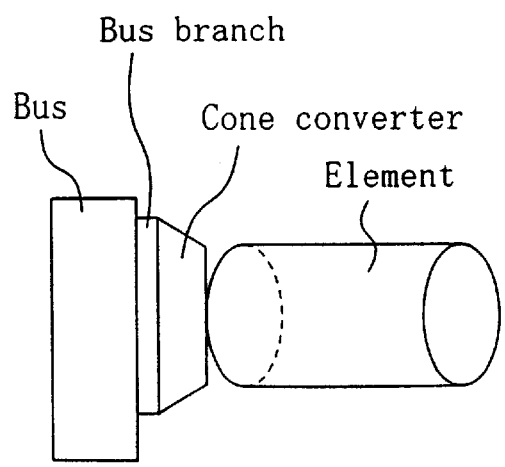
FIG. 24 is a view illustrating insertion of a cone converter for smooth connection between an element/plate and an element in the behavioral level design for an integrated circuit device in EMBODIMENT 3.

There are cases where the bottom areas of cylinders of elements fail to match each other and where the interface area of the cylindrical bus fails to match the bottom area of a cylinder of an element. In such cases, that is, when the bottom areas of elements are different from each other or the interface area of the bus is different from the bottom area of an element, a kind of bus called a "cone converter" is provided as shown in FIG. 24 to ensure smooth connection between the bus branch and the element. The cone converter connects two elements or an element and a bus (or a bus branch) and thereby adjusts the number of operations per cycle between the connected ones. Specifically, the cone converter is constructed of a bus including a FIFO circuit. In the case where conversion is made from a smaller cross-sectional area or bottom area to a larger cross-sectional area or bottom area, data corresponding to the smaller area can be accumulated to become equivalent to the larger area and then transferred to the larger area. In the case where the conversion is made from a larger cross-sectional area or bottom area to a smaller one, data corresponding to the larger area is divided into portions corresponding to the smaller area and transferred to the smaller area. In the small to large area conversion, an element or a bus connected to the large area portion of the cone converter can be operated at a lower speed than an element or a bus connected to the small area portion thereof. In the large to small area conversion, an element or a bus connected to the small area portion must be operated at a higher speed than an element or a bus connected to the large area portion.

In short, despite of the introduction of the default number of operations corresponding to the bottom area of a cylinder, there may arise a case where a bus and an element are not smoothly connected via a single medium of the default number of operations. To overcome this problem, while keeping the use of the default number of operations corresponding to the bottom area of a cylinder as a basis, the cone converter is provided when the default number of operations of the bus is different from that of the element. In this way, the bus and the element can be flexibly connected. A specific effect obtained by providing the cone converter will become apparent in a temporal simulation to follow.

In the RTL, a square converter, not a cone converter, may be used for connection between elements having different bottom areas or between an element and a bus (or a bus branch) having different bottom areas.

Temporal Simulation

Hereinafter, the processing in step ST5 shown in FIG. 20 will be described.

Figure 25A:
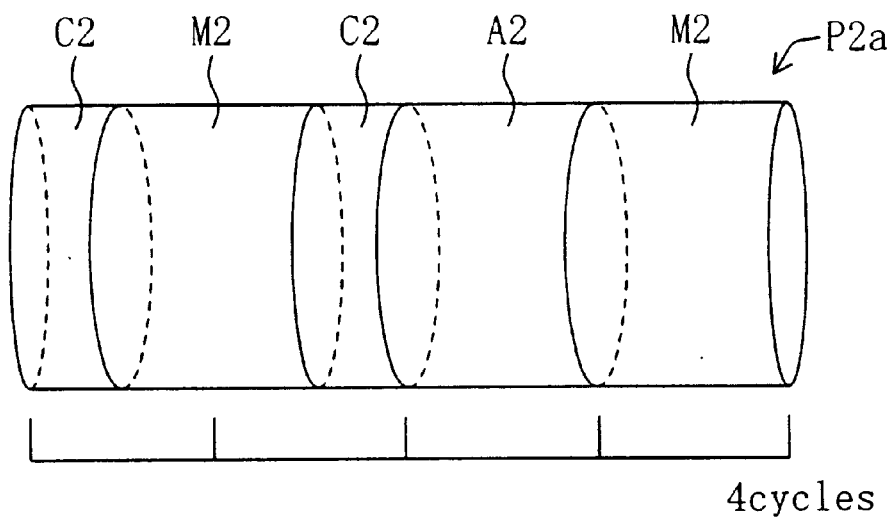
FIGS. 25(a) and 25(b) are views schematically illustrating temporal simulations of processes requiring no cone converter and requiring cone converters.

FIG. 25(a) schematically illustrates a temporal simulation of a process P2a in the case of requiring no cone converter, that is, the case where the selected elements match in "the number of operations per cycle" and the selected bus transmits "the number of operations per cycle". In this case, the cylinders representing the elements have the same bottom areas. Such cylinders can be connected in series as they are, and thus illustration of the bus may be omitted. For example, in FIG. 25(a) illustrating a temporal simulation for the elements corresponding to those used in the functional simulation shown in FIG. 22, the temporal simulation is expressed as sequential connection of the cylinders representing the elements C2, M2, C2, A2, and M2. Since the time required for the processing of each of the elements is "the number of operations/the bottom area of the cylinder", the total processing time of the process P2a is the value obtained by adding the axial lengths of the cylinders representing the elements C2, M2, C2, A2, and M2.

Figure 25B:
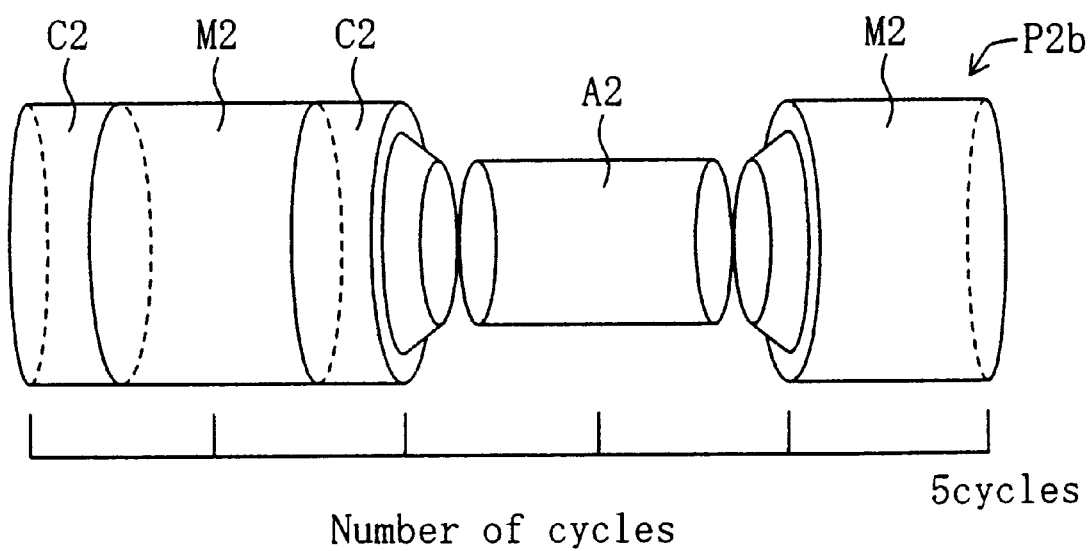

FIG. 25(b) schematically illustrates a temporal simulation of a process P2b in the case of requiring a cone converter, that is, the case where an element that does not match the bus in "the number of cycles per cycle" has been selected. As such a case, the followings are considered: One is a case where, in a search for a hardware resource (core) usable as an element having a certain necessary function, there is found no core having a bottom area matching the interface area of the bus. The other is a case where, although there exists a core having a bottom area matching the interface area of the bus, it is desired to select a more favorable core based on another parameter. In these cases, if only a core having a smaller bottom area is found for the operator, for example, it is required to provide a cone converter (for example, a bus including a FIFO circuit) between the elements A2 and C2 and between the elements A2 and M2. Otherwise, another bus and a cone converter may be provided, or another bus, a bus branch thereof, and a cone converter may be provided. For example, in FIG. 25(b) illustrating a temporal simulation for the elements corresponding to those used in the functional simulation shown in FIG. 22, the temporal simulation is expressed as sequential connection of the elements (cylinders) C2, M2, C2, A2, and M2 with two intervening cone converters. The total processing time in this case is the value obtained by adding the axial lengths of the elements (cylinders) C2, M2, C2, A2, and M2 and the axial lengths of the two cone converters. Although the element A2 shown in FIG. 25(b) has the same number of operations as the element A2 shown in FIG. 25(a), the axial length of the cylinder of the former is larger than that of the latter by an amount proportional to the reduced bottom area of the former. As a result, the total processing time of the process P2a is longer by the prolonged axial length of the element (cylinder) A2 in addition to the axial lengths of the cone converters.

Performance Analysis

Details of the performance analysis as the processing in step ST6 in FIG. 20 will be described. The performance analysis provides an indicator used as the most important criterion for selection of an optimum element. The default number of operations, i.e., "the number of operations per cycle", described above serves as a guide for search for a hardware resource (core) usable as an element connected to the bus. However, if most important performance fails to satisfy required conditions, it is not possible to design an integrated circuit device capable of providing a desired function. Performance analysis is therefore required to confirm the performance exhibited by a system incorporating the elements selected in the above processing.

Figure 26A:
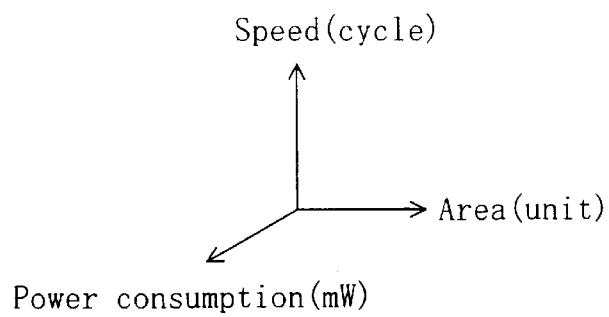
FIGS. 26(a) through 26(c) are views illustrating representation of performance in a three-dimensional coordinate system and the results of performance analysis for the processes subjected to the temporal simulation.

FIG. 26(a) is a representation of performance of a process in a three-dimensional coordinate system, using the speed (cycle), the (circuit) area (unit), and the power consumption (mV), for example, selected as parameters for evaluating the performance. The speed is obtained from the processing time calculated from the above temporal simulation. The area is obtained by adding the area occupied by the cores selected as the elements, the area occupied by the bus and the bus branches, and the area occupied by the cone converters. The power consumption, which is obtained by adding the amount of power consumed by the elements, includes mean power consumption and peak power consumption, both of which can be used as important parameters.

Figure 26B:
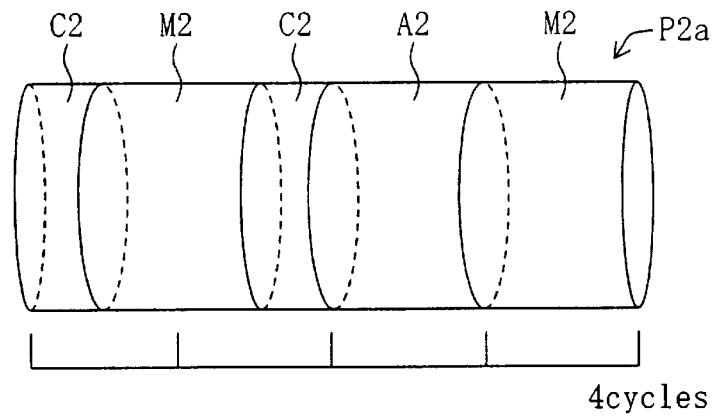
Figure 26C:
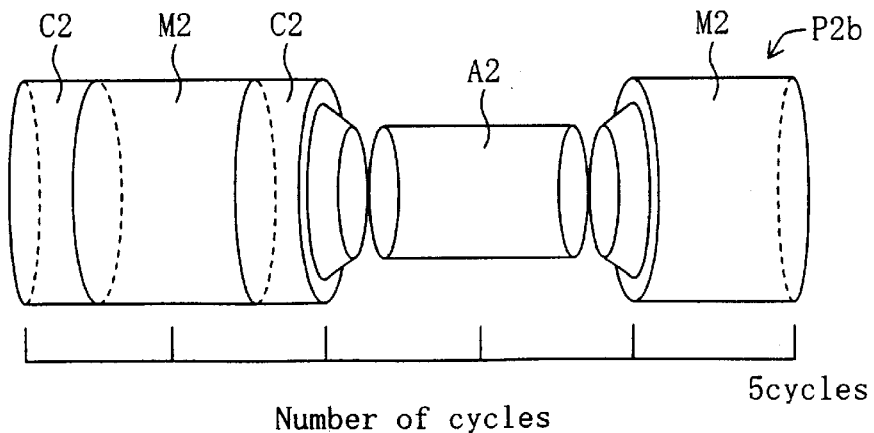

FIGS. 26(b) and 26(a) show the results of the performance analysis performed for the processes P2a and P2b that were subjected to the temporal simulation shown in FIGS. 25(a) and 25(b). As shown in FIG. 26(a), for the process P2a requiring no cone converter, the speed is 4 (cycles), the (circuit) area is 140 (units), and the power consumption is 1867 (mW). As shown in FIG. 26(b), for the process P2b requiring cone converters, the speed is 5 (cycles), the (circuit) area is 100 (units), and the power consumption is 800 (mW). If judged based on only these results, the process P2b is advantageous.

The database stores performance information of the respective elements. For example, assuming that performance information of each element includes descriptions on the layout area A, the number of toggles (signal transition probability) T, and the power consumption P as parameters for evaluating the performance, relational expression (1) below is established.

$$P = T \cdot q \cdot A \cdot V^2 \cdot F \quad (1)$$

where q denotes a constant, F denotes a frequency, and V denotes a voltage.

Function relational expressions (2) and (3) below for the layout area A and the number of toggles T have also been registered in the database.

$$A = \alpha \cdot M + \beta \quad (2)$$

$$T = \gamma \cdot M + \theta \quad (3)$$

where M denotes the number of operations, and $\alpha$, $\beta$, $\gamma$, and $\theta$ are all constants. That is, both the layout area A and the number of toggles T are a primary function of the number of operations M.

FIG. 27 is a graph showing the function relationships of the area A and the number of toggles T with the number of operations M. Above function relational expressions (1), (2), and (3) have been registered in the database as performance information.

FIG. 28 shows the values of the layout area A, the number of toggles T, and the power consumption P calculated from the above function relational expressions. As is found from FIG. 28, for the same element C2 as the operator, as the number of operations M is larger, both the layout area A and the number of toggles T are larger according to expressions (2) and (3). The power consumption is also larger according to expression (1). In this way, parameters required for evaluation of the performance of each of the elements C2, A2, M2, C3, and M3 used for processes P2 and P3 to be designed are obtained from information registered in the database and by calculating using the information.

Thus, an optimum solution in the behavioral level is determined from the performance analysis of the elements in consideration of most important parameters for the integrated circuit device to be designed and the like.

The "number of operations per cycle" in the setting of the bus structure is temporarily set at an initially appropriate value. However, in consideration of the case where plural types of simulations and performance analysis are desired, an optimum solution is determined after the determination in step ST8 shown in FIG. 20.

Specification/Behavioral Optimization Design

Hereinafter, an example of processing for optimizing the specification/behavioral level design in the above stream of design will be described.

Figures 29A, 29B, 29C:
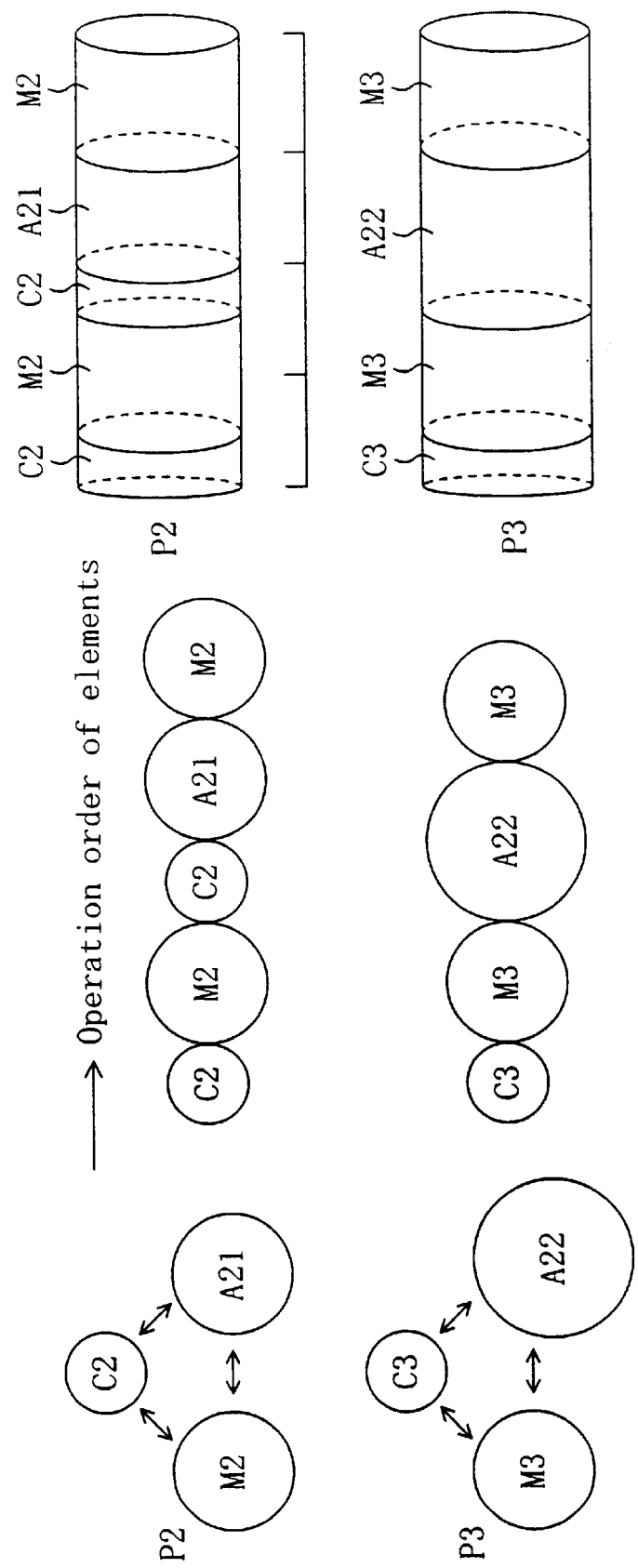
FIGS. 29(a) through 29(c) are views illustrating a design procedure for a plurality of processes in the specification/behavioral optimization design.

FIGS. 29(a) through 29(c) illustrate the above-described design procedure for a plurality of processes, P2 and P3. Although no bus is shown in FIGS. 29(a) through 29(c), it should be understood that there exist a bus B2 connecting elements (C2, M2, and A21) in the process P2 and a bus B3 connecting elements (C3, M3, and A22) in the process P3.

First, as shown in FIG. 29(a), the elements (C2, M2, and A21) required for the process P2 and the elements (C3, M3, and A22) required for the process P3 are selected at the initial stage in the specification level design. Next, as shown in FIG. 29(b), a functional simulation is carried out to determine the operation order of the elements. Thereafter, a bus, bus branches, and the like are prepared, and cylindrical elements are connected to the bus via the bus branches. After the connection, a temporal simulation is carried out as shown in FIG. 29(c). Note that FIG. 29(c) merely exemplifies the connection relationship among the elements in the temporal simulation. This does not represent quantitatively "the number of operations per cycle" as the default number of operations.

In the temporal simulation, if elements having the same function exist in the plurality of processes, P2 and P3, a sharing information table is made up for managing such a function and the common elements. FIG. 30 shows an example of such a sharing information table. As shown in FIG. 30, if the elements A21 and A22 satisfy the same function $A2_f$, the function $A2_f$ and the elements A21 and A22 are registered in the sharing information table.

FIG. 31 illustrates a specific temporal simulation in the case of sharing a resource. Referring to FIG. 31, in a temporal simulation for processes P2c and P3a, optimization of the number of operations per cycle (the bottom area of a cycle) is performed so that the common elements A21 and A22 do not overlap each other temporally.

FIGS. 32(a) through 32(d) illustrate a procedure for selecting optimum solutions for a plurality of processes, P2 and P3.

First, as sharing processing, the bottom area of the element A21 (A21-T1) in the process P2 is compared with the bottom area of the element A22 (A22-T2) in the process P3. The element having a larger bottom area (A22-T2 in the illustrated example) is determined as a shared resource.

From the above results, it becomes necessary to deform the process P2. This can be done by the first and second methods described below.

Figure 32:
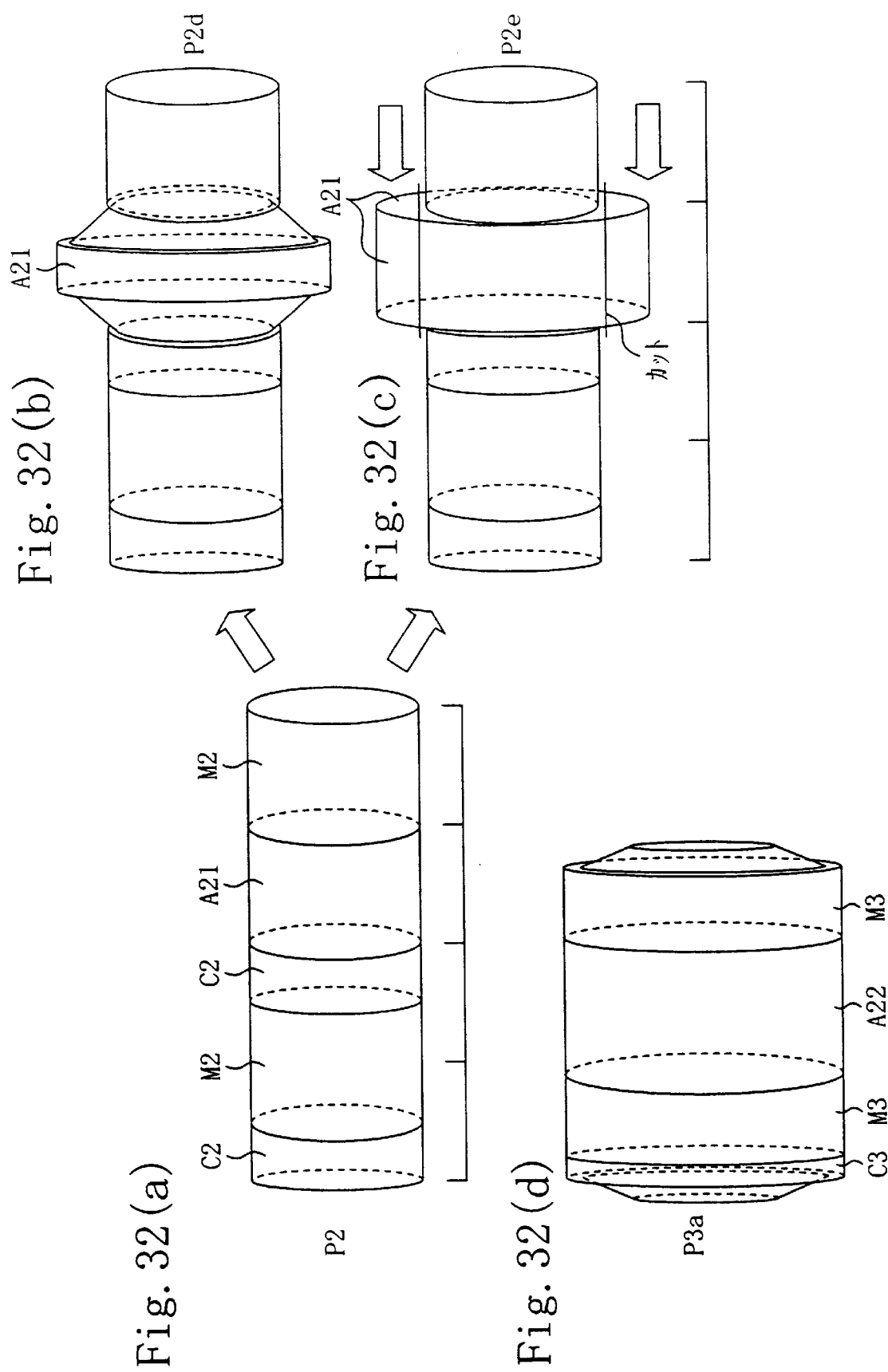
FIGS. 32(a) through 32(d) are views illustrating a procedure of selecting optimum solutions for a plurality of processes in the specification/behavioral optimization design.

In the first method, a process P2d shown in FIG. 32(b) is selected as the optimum solution, where the bottom area of the cylinder is enlarged to be equal to A22-T2 while keeping the number of operations of the element A21. This method requires provision of cone converters, but can reduce the axial length of the element A21. In the second method, a process P2e shown in FIG. 32(c) is selected as the optimum solution, which includes the element A21 having the bottom area A21-T1, obtained by cutting an unnecessary portion of the number of operations per cycle represented by the bottom area A22-T2 of the element A22. In this case, no cone converter is required since the bottom areas of the elements match the cross-sectional area of the bus. During the operation of the process P2e, operation for the unnecessary portion of the bottom area A22-T2 of the element A22 used as the shared element is cancelled.

The process P3 is deformed to a process P3a as shown in FIG. 32(d). That is, the process P3a is selected so that the element A22 is shared with the process P2. In the illustrated example, no deformation is eventually required for the cylinder of the element A22.

Thereafter, the performance analysis described above is carried out, and then an optimum solution is determined.

In this embodiment, sharing-intended design can be performed efficiently. By sharing a resource, the area can be reduced. With the reduction in area, reduction in applied voltage is expected. In addition, in the design at downstream stages where elements selected in the behavioral level are further specified and branched to some sub-elements, the number of combinations for branching is significantly reduced. This will enhance the design efficiency.

Embodiment 4

The second embodiment on the RTL design in the design of an integrated circuit device will be described.

Figure 33:
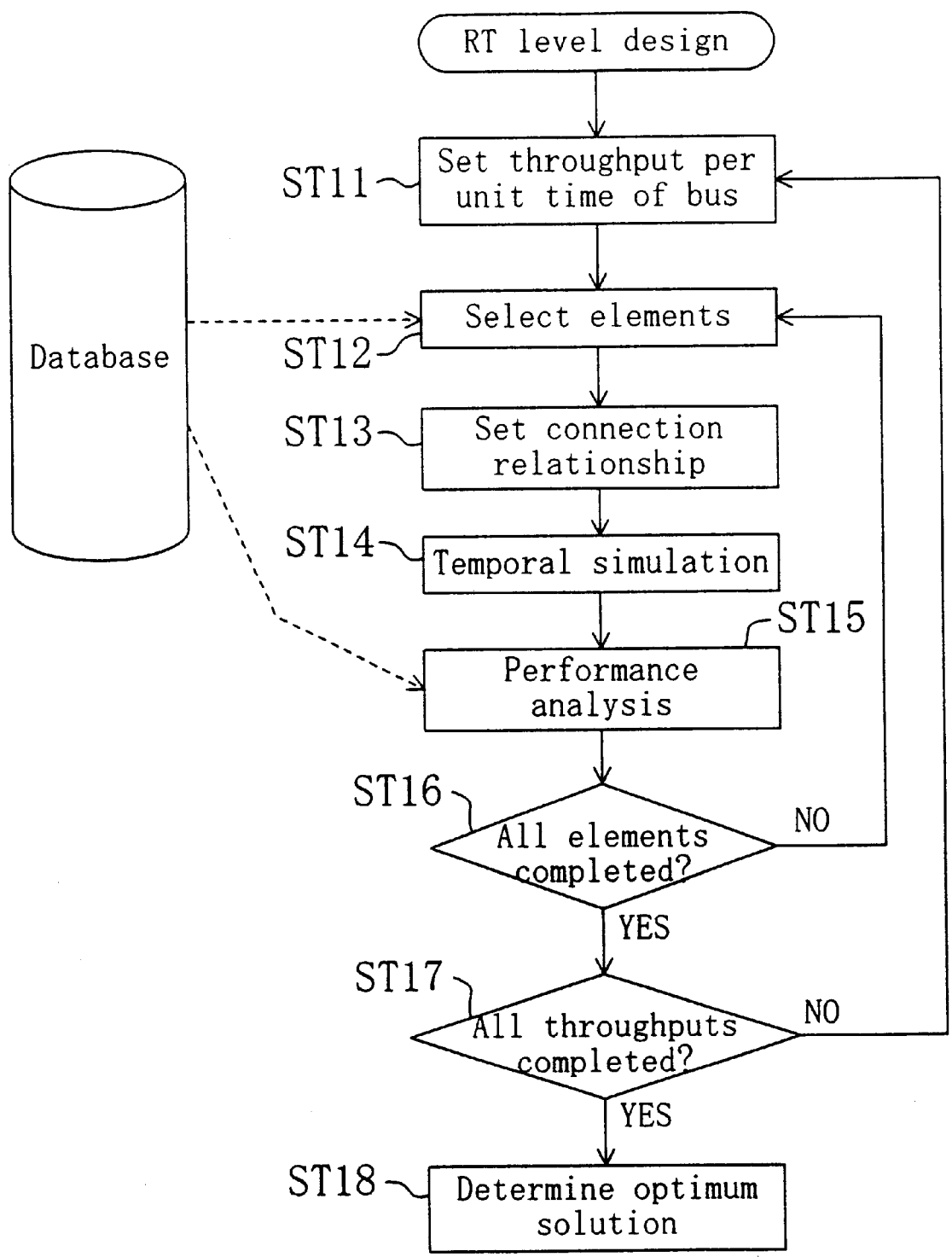
FIG. 33 is a flowchart showing a procedure of the RTL design for an integrated circuit device in EMBODIMENT 4.

FIG. 33 is a flowchart showing a procedure of the RTL design of an integrated circuit device.

First, in step ST11, the number of operations per cycle of a bus, that is, the cross-sectional area of a rectangle pole is set. In step ST12, cores having desired functions are retrieved from a database and selected as elements. In step ST13, interfaces of the bus, connections between the bus and the elements, and the like are set, to determine the connection relationship between the bus and each of the elements, thereby to be ready for simulation. In step ST14, a temporal simulation is carried out. By this temporal simulation, the processing time of each element can be calculated. Once the processing time is determined, the shape of the triangle pole representing the element is determined. In step ST15, performance analysis is carried out to evaluate the layout area, power consumption, processing speed, and the like of the selected elements.

Depending on the determination in steps ST16 and ST17, the processing in steps ST11 through ST15 may be repeated. Finally, in step ST18, an optimum solution is determined.

As described in EMBODIMENT 3 (with relation to FIG. 20), the number of operations per cycle of a bus, that is, the cross-sectional shape should basically be determined depending on the interface structure with an external apparatus. Therefore, as also described in EMBODIMENT 3, in the internal portion independent of the input/output with the external system, it is possible to freely change the data width and the like without constraints of the interface with the external system.

Therefore, depending on the determination in step ST17, the number of operations per cycle is changed a desired number of times, to carry out temporal simulations and performance analysis for the respective times.

Determination of an optimum solution is generally made based on overall consideration of the layout area, the power consumption, the processing time, and the like. In one method, attention is paid on a certain parameter, and only elements that satisfy requirements of the parameter are retrieved. Among the retrieved elements, a combination of elements that is most advantageous for other parameters is determined as the optimum solution. In another method, the layout area, the power consumption, the processing time, and the like are determined as main parameters. Parameters that influence the main parameters are further taken out as sub-parameters. A group of elements having sub-parameters that optimize the respective main parameters are first selected. Then, the optimum solution is obtained for the main parameters selected in the above manner.

Specific processing details for the above respective steps are as follows.

Shape of RTL Elements

FIGS. 34(a) through 34(a) illustrate how an element and a bus change during the shift from the behavioral level design to the RTL design. FIG. 34(a) illustrates an image of an element at the behavioral level described above. At this stage, the element was represented as a cylinder having "the number of operations per cycle" as the bottom area (cross-sectional area) and the number of cycles as the axial length. FIG. 34(b) illustrates three examples of images of the element at the RTL having different shapes. Referring to FIG. 34(b), at the RTL, the element and the bus are represented as rectangle poles, in place of cylinders. To state more specifically, at the RTL, also, the element is a function performing processing along a concrete time sequence. Therefore, the element is represented by a three-dimensional shape having "the number of operations per cycle" as the bottom area. At the RTL, however, a parameter specifically indicating "the number of operations per unit time" (data width, frequency) is newly provided. For example, as shown in FIG. 34(c), for the same area, 4, there exist three combinations of the number of operations per unit time and the period satisfying the area of 4. Therefore, the element or the bus is represented as a rectangle pole having a bottom of a rectangle the sides of which correspond to the number of operations per unit time (opn/ns) and the period (ns/cycle).

Connection Relationship Between Bus and Element

Figure 35A:
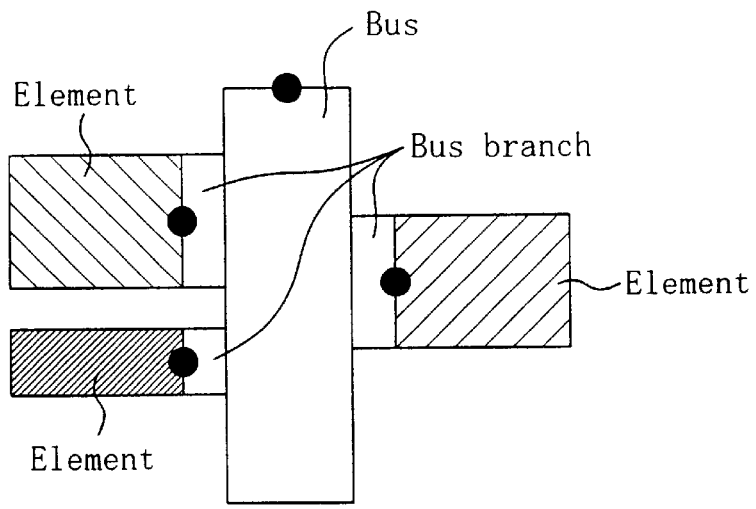
FIGS. 35(a) through 35(c) are a top view, a perspective view, and a side view, respectively, of images of connection between a bus and elements in the RTL.
Figure 35B:
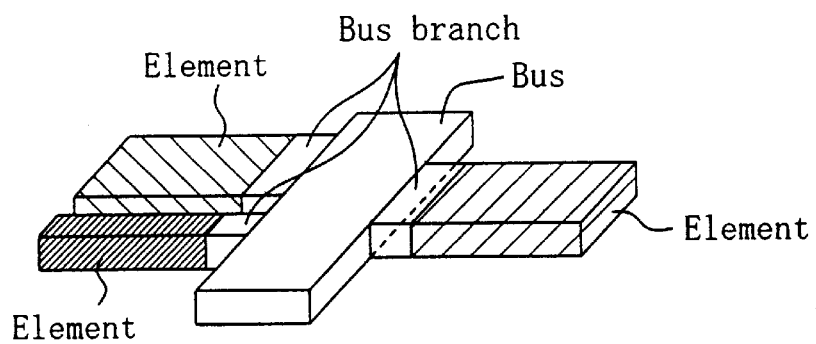
Figure 35C:
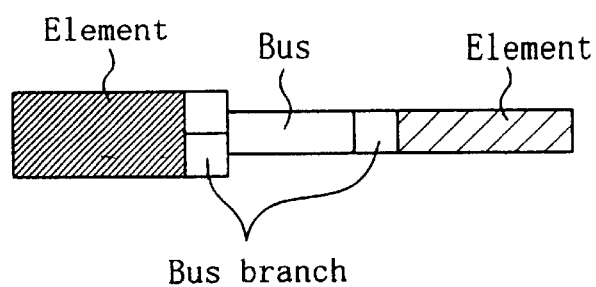
Figure 42:
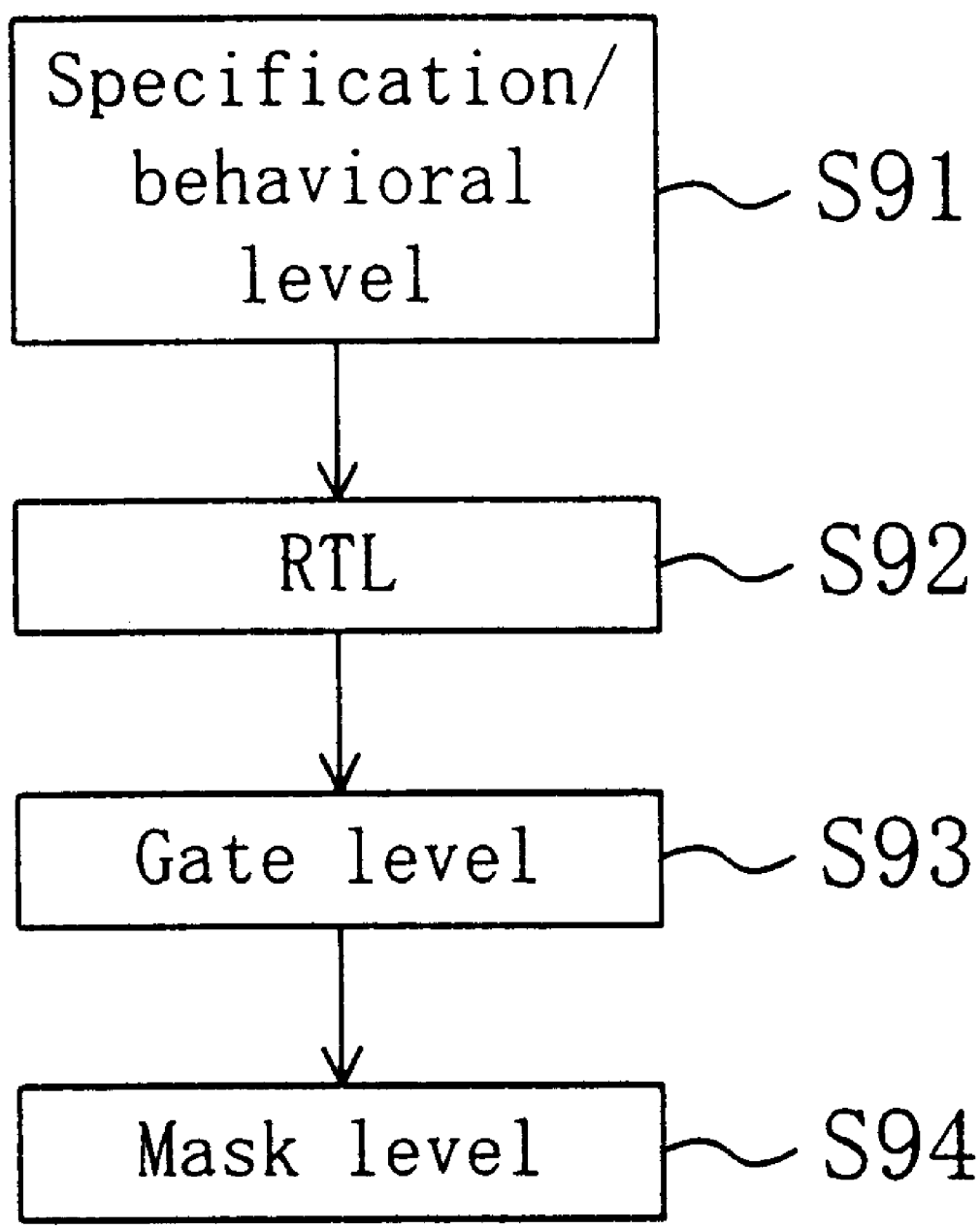
FIG. 42 is a flowchart showing a general procedure of designing an integrated circuit.

FIGS. 35(a) through 35(c) are a top view, a perspective view, and a side view, respectively, of images of connection between a bus and elements at the RTL.

At the RTL, the data width and the frequency are predetermined. Therefore, the bus can be represented as a flat plate having a cross section of which the length and width correspond to the number of operations per unit time and the period, respectively. Bus branches of a flat-plate shape are provided as portions connecting the bus and the elements. With this bus structure, smooth RTL design can be with this bus structure, smooth RTL design can be made.

Determination of Optimum Solution of Element

FIGS. 36(a) and 36(b) and FIGS. 37(a) and 37(b) illustrate procedures of evaluating the performance of an element at the RTL. The "number of operations per cycle" (bottom area of the cylinder) and the number of cycles (axial length of the cylinder) of a selected element were predetermined in the simulation and the processing for determination of an optimum solution at the behavioral level. In the RTL design, as shown in FIGS. 36(a) and 37(a), there are some combinations of the number of operations and the period for obtaining a prescribed bottom area. Elements of the number equal to the number of the combinations are shown as points on the two-dimensional coordinate system having two axes of the period and the number of operations per unit time. In FIGS. 36(a) and 37(a), such elements are shown by large, intermediate, and small three circles as an example. Note that the three circles in FIG. 36(a) and those in FIG. 37(a) do not correspond to each other.

To determine which one of these elements should be selected as the optimum solution, the layout area and the power consumption, for example, are used as indicators for determining the performance of each element. First, as shown in FIG. 36(b), the layout areas of the three elements are obtained from a performance table. In the illustrated example, the layout area is smaller in the order of the small, intermediate, and large circles. Next, as shown in FIG. 37(b), the power consumption values of the three elements are obtained from a performance table. The optimum solution is determined from trading-off between the layout area and the power consumption.

Optimization Design 1 in RTL

Optimization design for replacing a plurality of elements at the RTL with a shared element will be described.

Referring to FIGS. 38(a) and 38(b), assume that for the element A21-T1 selected in the behavioral level, two RTL elements that have the same bottom area but are different in the number of operations per unit time and the period, A21-T1a and A21-T1b (T denotes the area), are selected. Assume also that A21-T1a and A21-T1b do not operate in the same time period. In this case, as shown in FIG. 38(c), the period of the element A21-T1a is made equal to that of the element A21-T1b, and the number of operations per unit time of the element A21-T1b is made equal to that of the element A21-T1a. As a result, as shown in FIG. 38(d), a shared element A23-T1a common in the period and the number of operations per unit time is produced. Whether or not the shared element A23-T1 can replace the elements A21-T1a and A21-T1b is examined based on the layout area and the power consumption obtained from a performance table.

If it is determined possible to replace the elements A21-T1a and A21-T1b with the shared element A23-T1, the sharing is performed. By this sharing, the layout area can be reduced. With the reduction in area, reduction in power is possible.

FIGS. 39(a) and 39(b) illustrate operation before the replacement of the elements A21-T1a and A21-T1b with the shared element A23-T1 and operation after the replacement of the elements A21-T1a and A21-T1b with the shared element A23-T1. If the elements A21-T1a and A21-T1b do not operate in the same time period as shown in FIG. 39(a), the elements can be replaced with the shared element A23-T1 as shown in FIG. 39(b). Note that the replacing element A23-T1 includes a portion that is not used in the original element A21-T1a or A21-T1b. Operation of such an unnecessary portion is halted, and thus power consumption can be reduced.

Optimization design 2 in RTL

Processing for more flexible element sharing at the RTL design will be described.

FIGS. 40(a) through 40(d) illustrate sharing processing involving deformation of three elements. FIGS. 40(a), 40(b), and 40(c) illustrate temporal changes of elements M11-M12-T1, and M12-T2, respectively. The elements M11-T1 and M12-T1 have the same cross section.

First, search is made for elements having the same function that can be shared. Elements that do not operate in the same time period are suitable for sharing. However, in some cases like a memory, sharing is possible for even a plurality of elements that operate in the same time period. In the example shown in FIGS. 40(a) through 40(c), the elements M11-T1, M12-T1, and M12-T2 serving as a memory were retrieved as sharing candidates.

Among the sharing candidates, the element having the largest number of operations per unit time (in the illustrated example, the element M12-T2) is determined as the shared element.

Referring to FIG. 40(d), the elements M11-T1 and M12-T1 are replaced with the element M12-T2 having the largest bottom area.

There is a case where the elements M11-T1 and M12-T1 operate in the same time period. Therefore, whether or not simultaneous operation can be avoided is examined. If shifting on the time axis is allowed, the following operation is possible. That is, as shown in FIG. 40(d), both the elements M11-T1 and M12-T1 are replaced with the shared element M12-T2, and the operation of the shared element M12-T2 corresponding to the element M12-T1 is performed first, followed by the operation thereof corresponding to the element M11-T1, or vise versa.

Thus, by the sharing involving deformation of an element, it is possible to share an element without increasing the number of operations (volume of the rectangle pole). In addition, it is also possible to perform sharing for elements operating in the same time period.

Integration of Systems

Described below is an example of processing for integrating a plurality of systems by utilizing the above various types of sharing processing.

FIG. 41 illustrates a procedure of generating a new system SY3 by integrating already-designed systems SY1 and SY2. This integration may be desired in the following occasion, for example. When the system SY1 is a read-only system and the system SY2 is a write-only system, a system SY3 that performs both read and write operations may be designed.

In the example illustrated in FIG. 41, the system SY1 is constructed of elements C1 (control circuit), P1 (operator), and M1a and M1b (memories). The system SY2 is constructed of elements C2 (control circuit), P2 (operator), and M2 (memory). It is examined whether or not there are ones among the elements in the two systems SY1 and SY2 that have the same function and can be shared. As a result, it is found that the memories and the operators respectively can be shared.

The elements M1a, M1b, and M2 having the common function as the memory are lined on the same time axis, and the elements P1 and P2 having the common function as the operator are lined on the same time axis. The elements are then subjected to replacement with the element having the largest cross section, deformation, and the like as described above, to accomplish the sharing.

As a result, obtained is the readable/writable system SY3 that includes an element C1, C2 as the control circuit, the two elements M1b and M2 as the memory, and the single element P2 as the operator.

In the above description, no mention has been made of the structure of cores in a database. It should be noted that the present invention is also applicable to cores (also called VC clusters) of which data are stored in the database in the hierarchical state of the specification level, the behavioral level, the RT level, and the like, for example.

What is claimed is:

1. A method for designing an integrated circuit device, comprising representing a portion constituting the integrated circuit device by a three-dimensional shape, the type of the three-dimensional shape being determined depending on a design level,
   wherein the integrated circuit device has a plurality of functions,
   the portion comprises a plurality of elements required for implementing the plurality of functions, and
   each of the plurality of elements is represented by a three-dimensional shape of which a volume corresponds to the number of operations required for implementing the function.

2. The method for designing an integrated circuit device of claim 1, wherein in design at a level lower than a specification level, the element is represented by a pole of which a bottom area corresponds to the number of operations per cycle.

3. The method for designing an integrated circuit device of claim 2, wherein in behavioral level design, the element is represented by a cylinder of which a bottom is a circle having an area corresponding to the number of operations per cycle.

4. The method for designing an integrated circuit device of claim 2, wherein in register-transfer level (RTL) design, the element is represented by a square pole of which a bottom has two adjacent sides corresponding to the number of operations per unit time and a period of a cycle.

5. A method for designing an integrated circuit device, comprising representing a portion constituting the integrated circuit device by a three-dimensional shape, the type of the three-dimensional shape being determined depending on a design level,
   wherein the integrated circuit device includes a bus and a plurality of elements connected to the bus,
   the portion comprises the bus connecting the plurality of elements, and
   a connection relationship between the bus and each of the elements is represented by a three-dimensional shape so that a structure of the bus and a structure of the element match each other using the number of operations per unit time as a medium.

6. The method for designing an integrated circuit device of claim 5, wherein in design at a level lower than a specification level, the element is represented by a pole of which a bottom area corresponds to the number of operations per cycle, and the bus is represented by a pole of which a bottom area corresponds to the number of operations per cycle.

7. The method for designing an integrated circuit device of claim 6, wherein in behavioral level design, the element is represented by a cylinder of which a bottom is a circle having an area corresponding to the number of operations per cycle, and the bus is represented by a cylinder of which a bottom is a circle having an area corresponding to the number of operations per cycle.

8. The method for designing an integrated circuit device of claim 6, wherein in RTL design, the element is represented by a square pole of which a bottom has two adjacent sides corresponding to the number of operations per unit time and a period of a cycle, and the bus is represented by a square pole of which a bottom has two adjacent sides corresponding to the number of operations per unit time and a period of a cycle.

9. The method for designing an integrated circuit device of claim 6, wherein, when the bottom areas of the bus and the element are different from each other, the bus is represented by a cone of which two faces correspond to the bottoms of the bus and the element.

10. The method for designing an integrated circuit device of claim 6, wherein a bus branch branching from the bus to be connected to the element is further generated, the bus branch being represented by a pole having a cross-sectional area equal to the bottom area of the bus.

11. A method for designing an integrated circuit device, comprising the steps of:
   (a) obtaining the number of operations of at least a portion of the integrated circuit device by simulating a function of the integrated circuit device;
   (b) determining specification level elements so that each of the elements has the number of operations equal to or more than the number of operations obtained in the step (a);
   (c) determining a bus connecting the elements;
   (d) determining behavioral level elements so that each of the behavioral level elements has the number of operations per cycle and the number of cycles that give the number of operations equal to or more than the number of operations determined in the step (b); and
   (e) determining a behavioral level bus for connecting the behavioral level elements based on the number of operations per cycle determined in the step (d),
      wherein in the step (b), if a plurality of practicable specification level elements exist, one among the elements that has the least number of operations is determined as the specification level element used for design.

12. A method for designing an integrated circuit device, comprising the steps of:
   (a) obtaining the number of operations of at least a portion of the integrated circuit device by simulating a function of the integrated circuit device;
   (b) determining specification level elements so that each of the elements has the number of operations equal to or more than the number of operations obtained in the step (a);
   (c) determining a bus connecting the elements;
   (d) determining behavioral level elements so that each of the behavioral level elements has the number of operations per cycle and the number of cycles that give the number of operations equal to or more than the number of operations determined in the step (b); and
   (e) determining a behavioral level bus for connecting the behavioral level elements based on the number of operations per cycle determined in the step (d),
      wherein in the step (d), in the case where a plurality of practicable behavioral level elements exist,
      if design is made giving higher priority to operation speed, an element among the behavioral level elements that has the number of operations per cycle as large as possible is determined as the behavioral level element used for design, or if design is made giving higher priority to a smaller circuit area or smaller power consumption, an element among the behavioral level elements that has the number of operations per cycle as small as possible is determined as the behavioral level element used for design.

13. A method for designing an integrated circuit device, comprising the steps of:
(a) obtaining the number of operations of at least a portion of the integrated circuit device by simulating a function of the integrated circuit device;
(b) determining specification level elements so that each of the elements has the number of operations equal to or more than the number of operations obtained in the step (a);
(c) determining a bus connecting the elements;
(d) determining behavioral level elements so that each of the behavioral level elements has the number of operations per cycle and the number of cycles that give the number of operations equal to or more than the number of operations determined in the step (b);
(e) determining a behavioral level bus for connecting the behavioral level elements based on the number of operations per cycle determined in the step (d); and
(f) obtaining design data corresponding to the behavioral level element for implementing the function.

14. A method for designing an integrated circuit device, comprising the steps of:
(a) obtaining the number of operations of at least a portion of the integrated circuit device by simulating a function of the integrated circuit device;
(b) determining specification level elements so that each of the elements has the number of operations equal to or more than the number of operations obtained in the step (a);
(c) determining a bus connecting the elements;
(d) determining behavioral level elements so that each of the behavioral level elements has the number of operations per cycle and the number of cycles that give the number of operations equal to or more than the number of operations determined in the step (b); and
(e) determining a behavioral level bus for connecting the behavioral level elements based on the number of operations per cycle determined in the step (d),
wherein in the step (d), a plurality of elements having the same function are unified into a shared element.

15. The method for designing an integrated circuit device of claim 14, wherein in the step (d), in the unification, an element among the plurality of elements that has the maximum number of operations per cycle is determined as the shared element.

16. The method for designing an integrated circuit device of claim 15, wherein in the step (d), when an element is replaced with the shared element, a portion of the number of operations per cycle of the shared element exceeding the number of operations per cycle of the element to be replaced is not used.

17. A method for designing an integrated circuit device, comprising the steps of:
(a) obtaining the number of operations of at least a portion of the integrated circuit device by simulating a function of the integrated circuit device;
(b) determining specification level elements so that each of the elements has the number of operations equal to or more than the number of operations obtained in the step (a);
(c) determining a bus connecting the elements;
(d) determining behavioral level elements so that each of the behavioral level elements has the number of operations per cycle and the number of cycles that give the number of operations equal to or more than the number of operations determined in the step (b);
(e) determining a behavioral level bus for connecting the behavioral level elements based on the number of operations per cycle determined in the step (d);
(g) determining a RTL element so as to have the number of operations per unit time and the period that give the number of operations per cycle equal to or more than the number of operations per cycle of the behavioral level element determined in the step (d);
(h) determining a RTL bus based on the number of operations per unit time and the period; and
(i) determining design data corresponding to the RTL element for implementing the function.

18. The method for designing an integrated circuit device of claim 17, wherein in the step (g), in the case where a plurality of RTL practicable elements exist,
if design is made giving higher priority to operation speed, an element among the RTL elements that has the number of operations per unit time as large as possible is selected, or
if design is made giving higher priority to a smaller circuit area or smaller power consumption, an element among the RTL elements that has the number of operations per unit time as small as possible is selected.

19. The method for designing an integrated circuit device of claim 17, wherein in the step (g), a plurality of elements having the same function are unified into a shared element.

20. The method for designing an integrated circuit device of claim 19, wherein in the step (g), in the unification, an element having the number of operations per unit time and a period equal to the maximum of the number of operations per unit time and the maximum of the period of the plurality of elements is determined as the shared element.

21. The method for designing an integrated circuit device of claim 20, wherein in the step (g), when an element is replaced with the shared element, a portion of the number of operations per unit time and a portion of the period of the shared element exceeding the number of operations per unit time and the period of the element to be replaced are not used.

22. The method for designing an integrated circuit device of claim 17, wherein in the step (g), RTL elements operating in parallel are obtained for one behavioral level element.

23. The method for designing an integrated circuit device of claim 17, wherein in the step (g), RTL elements pipeline-operating sequentially are obtained for one behavioral level element.

24. The method for designing an integrated circuit device of claim 17, wherein in the step (g), each of the RTL elements is represented by a rectangle pole having a rectangular cross section of which two sides correspond to the number of operations per unit time and the period and an axial length corresponding to the number of cycles, and
in the step (h), the RTL bus is represented by a rectangle pole having a rectangular cross section of which two sides correspond to the number of operations and the period.

25. The method for designing an integrated circuit device of claim 17, wherein the elements are retrieved from a database storing elements as design data.

26. The method for designing an integrated circuit device of claim 25, wherein the design data has been obtained by use of intellectual properties (IPs) described to generate: basic circuits of the number corresponding to the value of an input parameter; and an adjusting circuit in relation to data input or output of the basic circuits.

27. The method for designing an integrated circuit device of claim 26, wherein each of the basic circuits includes:
   an operator circuit for performing an operation and outputting operation results as well as an output enable signal indicating whether or not the operation results are effective; and
   a serial/parallel converter circuit for converting the operation results input as serial data to parallel data and outputting the parallel data, the basic circuit thus outputting the parallel data and the output data enable signal, and
   the adjusting circuit includes:
      a selection circuit for receiving the parallel data and the output data enable signals output from the basic circuits, selecting, among the parallel data output from the basic circuits, parallel data output from the basic circuit that outputs the output data enable signal indicating that the operation results are effective, and outputting the selected parallel data.

28. The method for designing an integrated circuit device of claim 25, wherein the design data has been obtained by use of an IP described to generate: a circuit basic portion; parallel-connected circuit additional portions of the number corresponding to the value of an input parameter; and an adjusting circuit in relation to data input or output of the circuit additional portions.

29. The method for designing an integrated circuit device of claim 28, wherein the circuit basic portion includes:
   an operator circuit for performing an operation for input data and outputting operation results as well as an address signal designating a destination of the operation results and a data read/write control signal,
   each of the circuit additional portions includes:
      a buffer circuit for temporarily storing and then outputting the operation results in accordance with the address signal, and
   the adjusting circuit includes:
      a selection circuit for receiving outputs from the buffer circuits and the data read/write control signal, selecting one of the outputs from the buffer circuits in accordance with the data read/write control signal, and outputting the selected one.

30. The method for designing an integrated circuit device of claim 17, wherein the elements are generated by a generator.

31. A method for designing an integrated circuit device, comprising the steps of:
   (a) obtaining the number of operations of at least a portion of the integrated circuit device by simulating a function of the integrated circuit device;
   (b) determining specification level elements so that each of the elements has the number of operations equal to or more than the number of operations obtained in the step (a);
   (c) determining a bus connecting the elements;
   (d) determining behavioral level elements so that each of the behavioral level elements has the number of operations per cycle and the number of cycles that give the number of operations equal to or more than the number of operations determined in the step (b); and
   (e) determining a behavioral level bus for connecting the behavioral level elements based on the number of operations per cycle determined in the step (d),
      wherein in the step (d), for one specification level element, a plurality of behavioral level elements operating in parallel that have the total number of operations equal to the number of operations of the specification level element are obtained.

32. A method for designing an integrated circuit device, comprising the steps of:
   (a) obtaining the number of operations of at least a portion of the integrated circuit device by simulating a function of the integrated circuit device;
   (b) determining specification level elements so that each of the elements has the number of operations equal to or more than the number of operations obtained in the step (a);
   (c) determining a bus connecting the elements;
   (d) determining behavioral level elements so that each of the behavioral level elements has the number of operations per cycle and the number of cycles that give the number of operations equal to or more than the number of operations determined in the step (b); and
   (e) determining a behavioral level bus for connecting the behavioral level elements based on the number of operations per cycle determined in the step (d),
      wherein the integrated circuit device executes a plurality of processes in parallel, and
      in the step (d), if there are behavioral level elements having the same type of function that can be shared among the plurality of processes, the behavioral level elements are deformed so as to be executed at different times in the respective processes.

33. A method for designing an integrated circuit device, comprising the steps of:
   (a) obtaining the number of operations of at least a portion of the integrated circuit device by simulating a function of the integrated circuit device;
   (b) determining specification level elements so that each of the elements has the number of operations equal to or more than the number of operations obtained in the step (a);
   (c) determining a bus connecting the elements;
   (d) determining behavioral level elements so that each of the behavioral level elements has the number of operations per cycle and the number of cycles that give the number of operations equal to or more than the number of operations determined in the step (b); and
   (e) determining a behavioral level bus for connecting the behavioral level elements based on the number of operations per cycle determined in the step (d),
      wherein in the step (d), if the time period from completion of operation of a first behavioral level element until start of operation of a second behavioral level element is equal to or more than one cycle, the first behavioral level element is deformed so that the number of operations per cycle is smaller, to thereby reduce the time period to less than one cycle.

34. A method for designing an integrated circuit device, comprising the steps of:
   (a) obtaining the number of operations of at least a portion of the integrated circuit device by simulating a function of the integrated circuit device;
   (b) determining specification level elements so that each of the elements has the number of operations equal to or more than the number of operations obtained in the step (a);
   (c) determining a bus connecting the elements;

(d) determining behavioral level elements so that each of the behavioral level elements has the number of operations per cycle and the number of cycles that give the number of operations equal to or more than the number of operations determined in the step (b); and (e) determining a behavioral level bus for connecting the behavioral level elements based on the number of operations per cycle determined in the step (d), wherein in the step (d), if the time period from completion of operation of a first behavioral level element until start of operation of a second behavioral level element is equal to or more than one cycle, a behavioral level element for a circuit that retains output data of the first behavioral level element for the time period is obtained.

35. A method for designing an integrated circuit device, comprising the steps of:

(a) obtaining the number of operations of at least a portion of the integrated circuit device by simulating a function of the integrated circuit device;

(b) determining specification level elements so that each of the elements has the number of operations equal to or more than the number of operations obtained in the step (a);

(c) determining a bus connecting the elements;

(d) determining behavioral level elements so that each of the behavioral level elements has the number of operations per cycle and the number of cycles that give the number of operations equal to or more than the number of operations determined in the step (b); and (e) determining a behavioral level bus for connecting the behavioral level elements based on the number of operations per cycle determined in the step (d), wherein in the step (b), processing is paralleled for reducing the number of cycles required for the processing, and in the step (d), the behavioral level elements in parallel operation are deformed so that the number of operations per cycle is smaller.

36. A method for designing an integrated circuit device, comprising the steps of:

(a) obtaining the number of operations of at least a portion of the integrated circuit device by simulating a function of the integrated circuit device;

(b) determining specification level elements so that each of the elements has the number of operations equal to or more than the number of operations obtained in the step (a);

(c) determining a bus connecting the elements;

(d) determining behavioral level elements so that each of the behavioral level elements has the number of operations per cycle and the number of cycles that give the number of operations equal to or more than the number of operations determined in the step (b); and (e) determining a behavioral level bus for connecting the behavioral level elements based on the number of operations per cycle determined in the step (d), wherein in the step (b), each of the specification level elements is represented by a three-dimensional shape having a volume corresponding to the number of operations of the element, in the step (d), each of the behavioral level elements is represented by a pole having a cross-sectional area corresponding to the number of operations per cycle of the element and an axial length corresponding to the number of cycles of the element, and in the step (e), the behavioral level bus is represented by a pole having a cross-sectional area corresponding to the number of operations per cycle of the bus.

37. A database used for design of an integrated circuit device having a plurality of functions, the database comprising:

a design model section including specification level elements each having as a design parameter the number of operations required for implementing each of the plurality of functions, and behavioral level elements each having as design parameters the number of operations per cycle and the number of cycles; and a computation section including a relational expression for calculating the design parameters of the design models, wherein in the design model section, the specification level element is represented by a sphere having a volume corresponding to the number of operations, and the behavioral level element is represented by a pole having a cross section corresponding to the number of operations per cycle and an axial length corresponding to the number of cycles.

38. A database used for design of an integrated circuit device having a plurality of functions, the database comprising:

a design model section including specification level elements each having as a design parameter the number of operations required for implementing each of the plurality of functions, and behavioral level elements each having as design parameters the number of operations per cycle and the number of cycles; and a computation section including a relational expression for calculating the design parameters of the design models, wherein the design model section further includes RTL elements each determined by the number of operations per unit time, a period, and the number of cycles, and the computation section further includes a relational expression for calculating the number of operations per unit time, the period, and the number of cycles from the number of operations and the number of cycles of the behavioral level element.

39. A database used for design of an integrated circuit device having a plurality of functions, the database comprising:

a design model section including specification level elements each having as a design parameter the number of operations required for implementing each of the plurality of functions, and behavioral level elements each having as design parameters the number of operations per cycle and the number of cycles; and a computation section including a relational expression for calculating the design parameters of the design models, wherein in the design model section, the RTL element is represented by a rectangle pole having a rectangular cross section of which two sides correspond to the number of operations per unit time and the period and an axial length corresponding to the number of cycles.

* * * * *